United States Patent
Rachmady et al.

(10) Patent No.: US 12,369,399 B2
(45) Date of Patent: Jul. 22, 2025

(54) GATE-TO-GATE ISOLATION FOR STACKED TRANSISTOR ARCHITECTURE VIA SELECTIVE DIELECTRIC DEPOSITION STRUCTURE

(71) Applicant: Intel Corporation, Santa Clara, CA (US)

(72) Inventors: Willy Rachmady, Beaverton, OR (US); Sudipto Naskar, Portland, OR (US); Cheng-Ying Huang, Hillsboro, OR (US); Gilbert Dewey, Beaverton, OR (US); Marko Radosavljevic, Portland, OR (US); Nicole K. Thomas, Portland, OR (US); Patrick Morrow, Portland, OR (US); Urusa Alaan, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 820 days.

(21) Appl. No.: 17/445,856

(22) Filed: Aug. 25, 2021

(65) Prior Publication Data
US 2023/0073078 A1    Mar. 9, 2023

(51) Int. Cl.
H10D 30/62    (2025.01)
H10D 86/01    (2025.01)
(Continued)

(52) U.S. Cl.
CPC ......... H10D 86/60 (2025.01); H10D 86/0221 (2025.01); H10D 86/451 (2025.01); H10D 86/421 (2025.01)

(58) Field of Classification Search
CPC ............... H01L 27/1248; H01L 27/127; H01L 27/1222; H01L 21/32; H01L 27/0688;
(Continued)

(56) References Cited

U.S. PATENT DOCUMENTS

2018/0366375 A1*  12/2018  Chen ............... H01L 21/823431
2019/0172828 A1    6/2019  Smith et al.
(Continued)

FOREIGN PATENT DOCUMENTS

WO    2018200006 A1    11/2018

OTHER PUBLICATIONS

Extended European Search Report received for EP application No. 22182940.1, dated Dec. 12, 2022. 14 pages.
(Continued)

*Primary Examiner* — Samuel Park
(74) *Attorney, Agent, or Firm* — Finch & Maloney PLLC

(57) ABSTRACT

An integrated circuit structure having a stacked transistor architecture includes a first semiconductor body (e.g., set of one or more nanoribbons) and a second semiconductor body (e.g., set of one or more nanoribbons) above the first semiconductor body. The first and second semiconductor bodies are part of the same fin structure. The distance between an upper surface of the first semiconductor body and a lower surface of the second semiconductor body is 60 nm or less. A first gate structure is on the first semiconductor body, and a second gate structure is on the second semiconductor body. An isolation structure that includes a dielectric material is between the first and second gate structures, and is on and conformal to a top surface of the first gate structure. In addition, a bottom surface of the second gate structure is on a top surface of the isolation structure, which is relatively flat.

20 Claims, 13 Drawing Sheets

(51) Int. Cl.
*H10D 86/40* (2025.01)
*H10D 86/60* (2025.01)

(58) Field of Classification Search
CPC ............ H01L 27/088; H01L 29/42392; H01L 29/78696; H01L 21/823437; H01L 21/823828; H01L 21/823878; H01L 27/092; H01L 29/0673; H01L 29/20; H01L 29/66439; H01L 29/66469; H01L 29/775; H01L 21/823481; H01L 21/8221; B82Y 10/00; H10D 86/60; H10D 86/0221; H10D 86/451; H10D 86/421; H10D 30/6757; H10D 30/014; H10D 30/43; H10D 30/6735; H10D 62/121; H10D 62/85; H10D 84/0151; H10D 84/83; H10D 88/00; H10D 84/0135; H10D 88/01; H10D 84/0172; H10D 84/0188; H10D 84/85; H10D 84/038
See application file for complete search history.

(56) References Cited

U.S. PATENT DOCUMENTS

| | | | |
|---|---|---|---|
| 2020/0006331 A1* | 1/2020 | Lilak | H01L 29/66545 |
| 2020/0027983 A1* | 1/2020 | Bentley | H01L 29/66666 |
| 2020/0035569 A1 | 1/2020 | Frougier et al. | |
| 2020/0340112 A1 | 10/2020 | Wolf et al. | |
| 2021/0202497 A1 | 7/2021 | Lin et al. | |

OTHER PUBLICATIONS

Yarbrough, et al., "Next generation nanopatterning using small molecule inhibitors for area-selective atomic layer deposition," J. Vac. Sci. Technol. A 39, (2021). 13 pages.

* cited by examiner

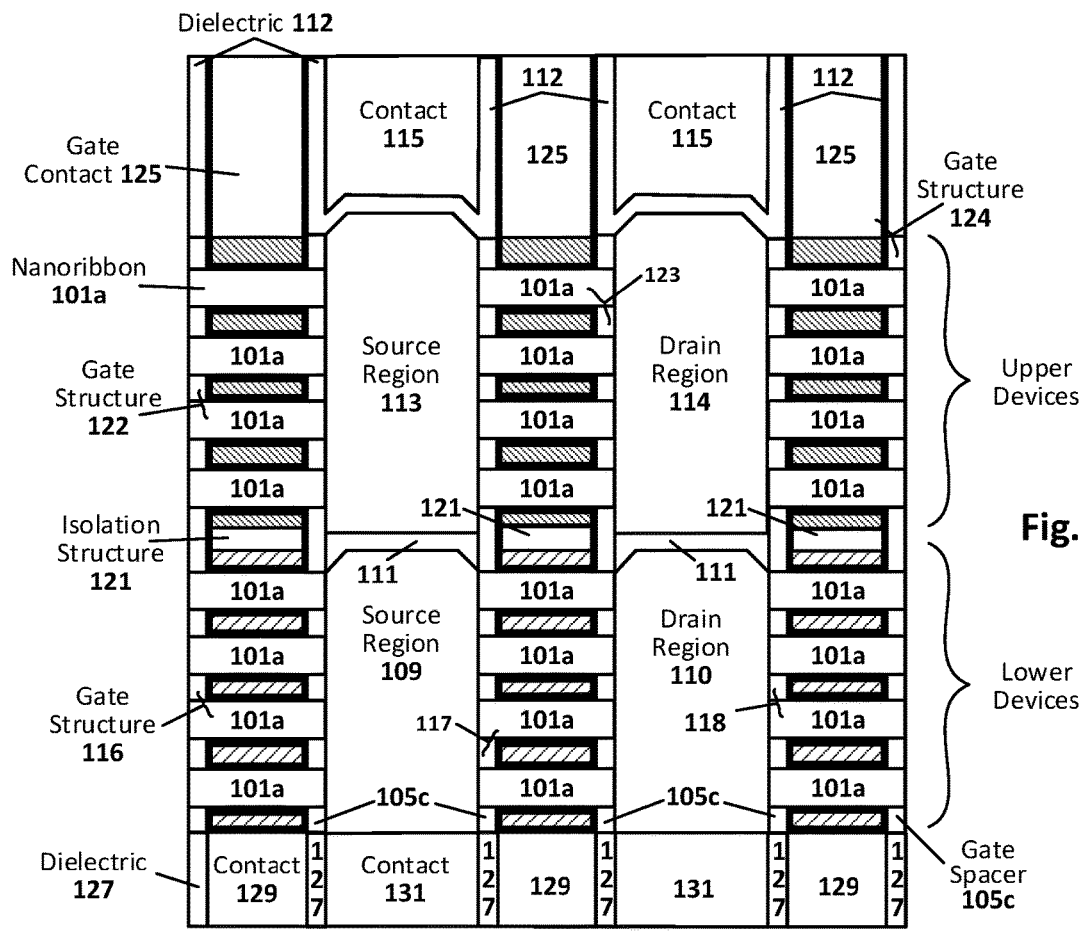
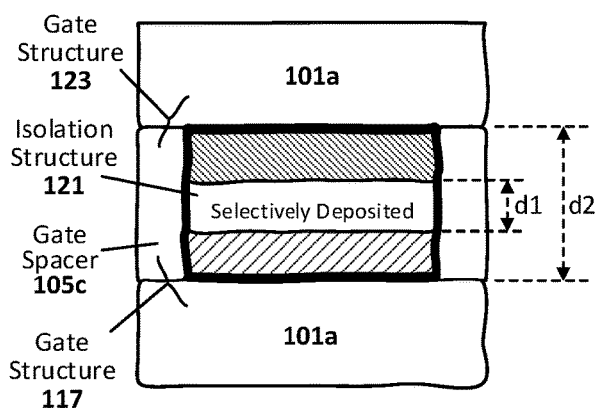
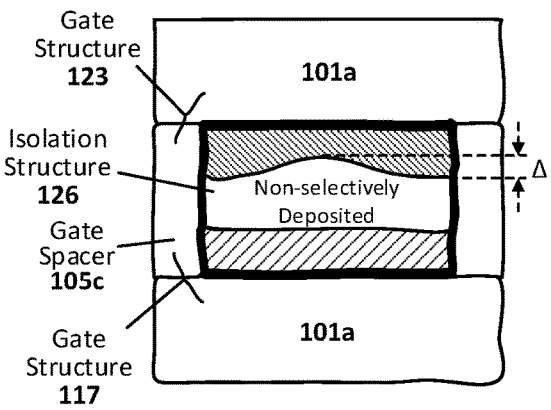
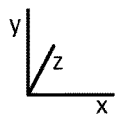
Fig. 1a
Fig. 1b
Fig. 1c

Example Fin Types:
- Native Fin or Non-native Fin
- Multilayer Fin (for nanowire or nanoribbon configurations)
- Combination (e.g., fin on top and nanowire/ribbon on bottom, or vice-versa)

GATE-TO-GATE ISOLATION FOR STACKED TRANSISTOR ARCHITECTURE VIA SELECTIVE DIELECTRIC DEPOSITION STRUCTURE

FIELD OF THE DISCLOSURE

The present disclosure relates to integrated circuits, and more particularly, to stacked transistors.

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the z-dimension (build upwards rather than laterally outwards in the x- and y-dimensions). Some such 3D integrated circuits are formed utilizing a technique known as layer transfer. Such layer transfer may include, for instance, bond and hydrogen-based or hydrogen/helium based cleave techniques. Other 3D integrated circuits are formed by separately forming transistors on two distinct wafers (sometimes referred to as host and donor wafers or substrates) and then bonding those two wafers together via an oxide bonding layer, followed by chemical-mechanical polish (CMP) operations to remove excess wafer. Still other 3D integrated circuits are achieved by forming transistors on upper and lower regions of the same fin structure. In any such cases, such 3D integration schemes provide a stacked transistor architecture and give rise to a number of non-trivial issues.

BRIEF DESCRIPTION OF THE DRAWINGS

FIG. 1a illustrates a cross-section view of an integrated circuit structure including a stacked transistor configuration having gate-to-gate isolation provided by a selective deposition structure, in accordance with an embodiment of the present disclosure.

FIG. 1b illustrates a cross-section view of a selective deposition structure, in accordance with an embodiment of the present disclosure.

FIG. 1c illustrates a cross-section view of a non-selective deposition structure.

Figure 2:
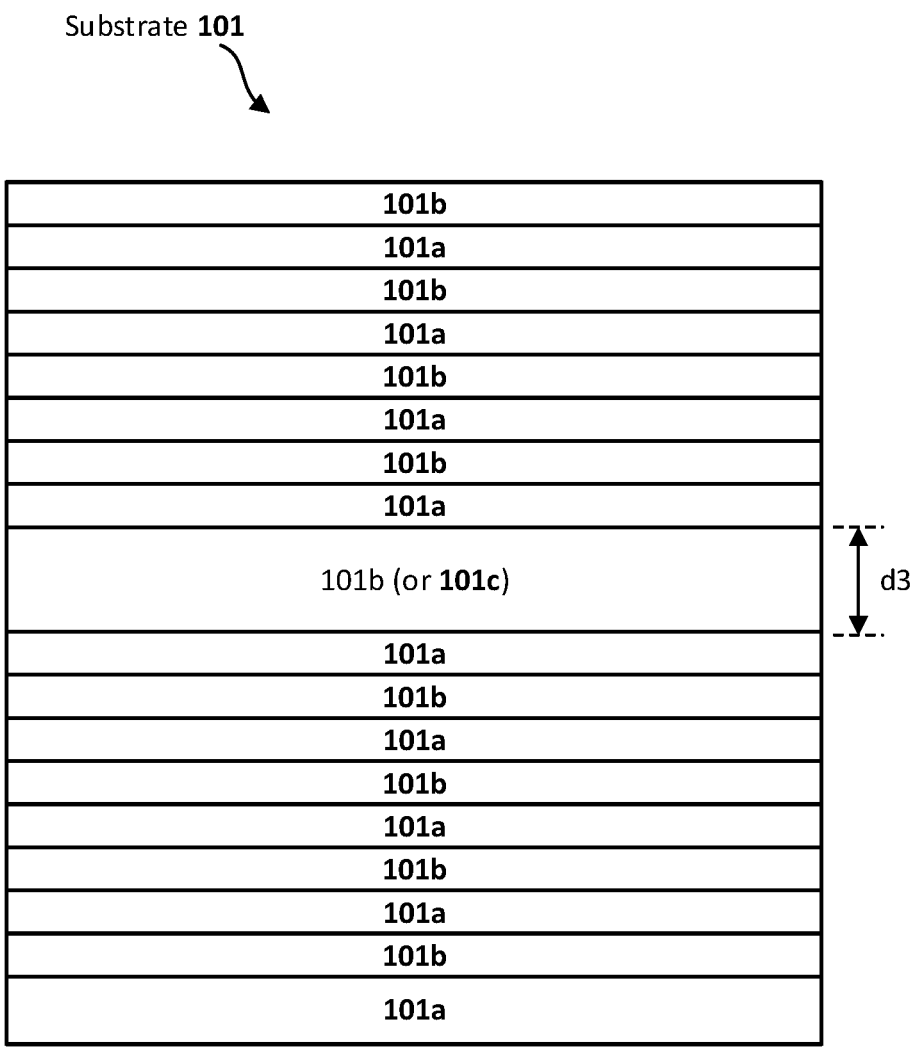
FIGS. 2-11b are cross-sectional views that collectively illustrate an example process for forming an integrated circuit structure including a stacked transistor configuration having gate-to-gate isolation provided by a selective deposition structure, in accordance with some embodiments of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

A stacked transistor architecture is disclosed that employs a common fin structure that includes lower transistor and upper transistor portions. Although the techniques can be used with any number of transistor configurations, they are particularly useful with nanoribbon transistor configurations, due to the various challenging aspect ratios attributable to the pancake-like nature of nanoribbons. One example embodiment provides an integrated circuit structure having a stacked transistor architecture includes a first semiconductor body (e.g., first set of one or more nanoribbons, or a first fin portion) and a second semiconductor body (e.g., second set of one or more nanoribbons, or a second fin portion) above the first semiconductor body. The first and second semiconductor bodies are part of the same fin structure. The distance between an upper surface of the first semiconductor body and a lower surface of the second semiconductor body is in the range of, for example, 15 to 50 nanometers (nm). A first gate structure is on the first semiconductor body, and a second gate structure is on the second semiconductor body. An isolation structure that includes a dielectric material is between the first and second gate structures, and is on and conformal to a top surface of the first gate structure. In addition, a bottom surface of the second gate structure is on a top surface of the isolation structure, which is relatively flat. For instance, in some examples, the width of the isolation structure between the first and second gate structures varies less than 1 nm. The isolation structure can be formed via a selective deposition process such as area-selective atomic layer deposition (ALD), according to some embodiments.

General Overview

As previously noted above, stacked transistor configurations give rise to a number of non-trivial issues. For instance, integrated circuits employing stacked complementary metal oxide semiconductor (CMOS) architecture may use vertical isolation between p-type MOS (PMOS) and n-type MOS (NMOS) metal gates. In a more general sense, a stacked transistor architecture may call for vertical isolation between upper and lower metal gate structures. One possible solution for providing such isolation can be carried out during the gate forming process and involves first forming the lower gate structure, followed by depositing a dielectric material to fill up the remaining gate trench and then recessing it using an isotropic etch to leave an isolation layer behind. The upper gate structure can then be formed on that isolation layer, and the upper channel region. Such solutions rely on there being a relatively large distance between the upper and lower channel regions (e.g., greater than 50 nm, such as 75 to 125 nm, or more). However, with continued scaling, there will be a very narrow margin/space budget available between the upper and lower channel regions (e.g., 50 nm or less). To this end, if there is inadequate margin/space budget between the top of the lower gate structure and the bottom-most surface of the upper channel region, the isolation layer tends to take on a profile that is conformal to the isotropic recess etch, rather than the top surface of the lower gate structure. In particular, the isolation layer exhibits a peak under the lowest surface of the upper channel region. The closer the top of the isolation layer is to the lowest surface of the upper channel region, the more pronounced the peak or non-conformality of the isolation layer. Likewise, the longer and/or wider the lowest surface of the upper channel region, the more pronounced the peak or non-conformality of the isolation layer. This is particularly problematic for nanoribbon channel regions, which tend to be relatively thin in the y-dimension but relatively long in the x-dimension and/or relatively wide in the z-dimension. In any case, such non-conformality of the isolation layer tends to decrease the thickness of the gate electrode for the lowermost nanoribbon or portion of the upper channel region, thereby causing inconsistent gate dimension.

Thus, techniques are disclosed for providing a conformal dielectric film to provide electrical isolation between upper and lower gate structures in a stacked transistor architecture. The dielectric film is formed by selective deposition and is conformal to the underlying gate structure topography. As such, the top surface of the dielectric film is substantially flat, relative to a dielectric layer formed by a non-selective deposition and etch-back process. The dielectric film therefore does not extend into or otherwise meaningfully impact the shape or thickness of the upper gate structure. Although the techniques can be used with any number of transistor configurations, they are particularly useful with nanoribbon transistor configurations, due to the various challenging aspect ratios attributable to the pancake-like nature of nanoribbons. In such cases, the gate structure wraps around the nanoribbon(s). The techniques may also be used, for example, with tri-gate and double-gate transistor configurations, where the gate structure is on both sides of a semiconductor fin (double-gate) or both sides and the top of the fin (tri-gate). In a more general sense, the techniques can be used in any stacked transistor configurations where there is a relatively small distance between the lower and upper semiconductor bodies that make up the lower and upper channel regions, respectively. Numerous configurations will be apparent in light of this disclosure.

One example embodiment provides an integrated circuit structure that includes a first set of one or more nanoribbons and a second set of one or more nanoribbons above the first set. The first and second sets of nanoribbons are part of the same multilayer fin structure. The distance between the upper surface of the uppermost nanoribbon of the first set and the lower surface of the lowermost nanoribbon of the second set is 50 nm or less (e.g., 15 to 50 nm). A first gate structure wraps arounds the first set of one or more nanoribbons, and a second gate structure wraps around the second set of one or more nanoribbons. Note that a portion of each of the first and second gate structures occupies the space between the upper surface of the uppermost most nanoribbon of the first set and the lower surface of the lowermost nanoribbon of the second set. An isolation structure is between the first and second gate structures. The isolation structure includes a dielectric material (e.g., oxide, nitride, carbide, or a combination thereof) and is on and conformal to a top surface of the first gate structure. In addition, a bottom surface of the second gate structure is on a top surface of the isolation structure. The isolation structure has a thickness between the first and second gate structures that varies less than 1 nm (e.g., such as less than 8 angstroms, or less than 5 angstroms), and is thus relatively flat. The thickness of the isolation structure can vary from one embodiment to the next, but in some example cases is in the range of 5 to 45 nm.

The dielectric material of the isolation structure can vary from one embodiment to the next, but in some example cases includes silicon, and one or more of oxygen, carbon, and nitrogen. Some specific examples for the dielectric material of the isolation structure include silicon dioxide, silicon carbide, silicon nitride, silicon oxycarbide, silicon oxynitride, or silicon oxycarbonitride. In a more general sense, the dielectric material of the isolation structure can be any dielectric film that can selectively deposit on the exposed conductive material of the lower gate structure, rather than on the surrounding dielectric surfaces such as any exposed high-k gate dielectric, interlayer dielectric, and/or gate spacer.

The first gate structure includes a first gate electrode, and a first gate dielectric between the first gate electrode and the first set of one or more nanoribbons. Likewise, the second gate structure includes a second gate electrode and a second gate dielectric between the second gate electrode and the second set of one or more nanoribbons. The gate dielectrics can include, for example, a high-k dielectric (e.g., hafnium oxide) and may further include an underlying standard oxide (e.g., oxide native to the nanoribbon material, such as silicon dioxide). The gate electrodes can include a workfunction metal (e.g., titanium nitride for PMOS, or titanium aluminum carbide for NMOS) and a plug metal (e.g., tungsten). A conformal gate spacer (e.g., silicon oxycarbonitride) may be provided to either side of the gate stack (gate dielectric and electrode), and in some example embodiments may also deposit on, and be left on, sides of the fin structure in the source and drain regions and thus operate to constrain growth of epitaxial source and drain regions.

The integrated circuit structure may further include a first source region and a first drain region, each adjacent to the first set of one or more nanoribbons. Similarly, a second source region and a second drain region are adjacent to the second set of one or more nanoribbons. In this particular embodiment, the first and second source and drain regions are formed by an etch and replace process (also referred to as an epitaxial source and drain process), and comprise any number of doped semiconductor material (e.g., group IV such as silicon, germanium, or silicon germanium, or group III-V semiconductors such as indium gallium arsenide). In one example case, the first source and drain regions include a p-type dopant (e.g., boron doped silicon germanium, SiGe), and the second source and drain regions include an n-type dopant (e.g., phosphorus-doped silicon). In other embodiments, the first and second source and drain regions can be implantation-doped portions of the fin structure.

Another example embodiment provides a method of forming an integrated circuit structure including a stacked transistor architecture with a self-aligned dielectric isolation layer between top and bottom gate structures. The method can be carried out, for example, as part of a gate-last process flow (although gate-first processes may also benefit from the techniques provided herein, as will be appreciated). In one such case, the method includes removing dummy gate material to expose upper and lower channel regions of the stacked transistor architecture, the upper and lower channel regions being part of a same multilayer fin structure. With the channel regions now exposed, the method continues with releasing, via a selective etch process, a first nanoribbon of the lower channel region and a second nanoribbon of the upper channel region. This releasing may include, for instance, a selective etch that removes SiGe layers of an alternating silicon-SiGe multilayer fin structure to release silicon nanoribbons, or a selective etch that removes the silicon layers of the multilayer fin structure to release SiGe nanoribbons. The method continues with forming a first gate structure around each of the first and second nanoribbons of the lower and upper channel regions, respectively, and then recessing that first gate structure to re-expose the upper channel region, including the second nanoribbon. The method continues with selectively and conformally depositing an isolation structure on a top surface of the first gate structure, the isolation structure including dielectric material that selectively deposits on conductive material of the first gate structure. The method continues with forming a second gate structure around the second nanoribbon of the upper channel region, the second gate structure on a top surface of the isolation structure.

In some such embodiments, selectively and conformally depositing an isolation structure includes applying a small molecule passivant that selectively deposits on exposed dielectric material only (rather than on any exposed conductive material), and then depositing the dielectric material of the isolation structure that selectively deposits on the conductive material of the first gate structure rather than the small molecule passivant. The small molecule passivant may include, for example, an amino silane. The dielectric material of the isolation structure may include, for example, silicon, and one or more of oxygen, carbon, and nitrogen. In some embodiments, the distance from a top surface of the first nanoribbon to a bottom surface of the second nanoribbon is in the range of 15 to 50 nm. In some embodiments, the isolation structure has a thickness between the first and second gate structures that varies less than 1 nm (e.g., less than 5 angstroms), the thickness being in the range of 5 to 35 nm. Numerous variations will be apparent.

The method may further include forming a first source region and a first drain region, each adjacent to the first nanoribbon, and forming a second source region and a second drain region, each adjacent to the second nanoribbon. According to one example embodiment, the method provides a stacked CMOS structure with a self-aligned selectively deposited dielectric layer that provides electrical isolation between the gate structures of upper (e.g., NMOS) and lower (e.g., PMOS) nanoribbon transistors. The dielectric layer is selective in that dielectric film (e.g., such as silicon oxycarbide) grows only on conductive materials of the exposed lower gate structure, and not on the surrounding dielectric surfaces such as high-K gate dielectric, interlayer dielectric, and/or gate spacer.

Contacts for any of the gate structures, source regions, and drain regions can then be formed (e.g., frontside and/or backside contact processing). Note, not all gate structures, source regions, and drain regions need to be contacted. Further note that not all upper and lower gate structures need to be separated by an isolation structure; rather, some upper and lower gate structure pairs may be electrically shorted to one another (with a conductive structure, rather than an isolation structure).

As will be appreciated in light of this disclosure, the techniques allow for a self-aligned isolation structure having a thickness that is independent of the length and width of the upper channel region. As such, the relatively large separation normally needed between the top surface of the lower gate structure and the lowermost surface of the upper channel region can be significantly reduced, and therefore enable, for example, a stacked CMOS structure with minimal or otherwise reduced space between upper and lower channel regions. Use of the techniques provided herein will be apparent, for example, via transmission electron microscopy (TEM) or high-resolution scanning electron microscopy (SEM) imaging tools, which will reveal placement of a conformal and relatively flat dielectric structure in a relatively narrow space between upper and lower channel regions.

Note that the top and bottom channel regions of the fin structure may be configured the same or differently, with respect to shape and/or semiconductor materials, and may further include fin-based channel regions, nanowire-based channel regions, or nanoribbon-based channel regions. For instance, in one example, the lower channel region of the fin structure can be a fin portion of the fin structure and the upper channel region can include one or more nanoribbons or nanowires included in the fin structure. In such cases, the nanoribbons or nanowires are released during gate processing by removing sacrificial material also included in the fin structure. In some such example cases, the lower portion of the fin structure comprises, for instance, SiGe or germanium suitable for PMOS devices, and the wires or ribbons of the upper portion of the fin structure comprise a group III-V semiconductor material such as indium gallium arsenide, indium arsenide, or gallium antimonide suitable for NMOS devices. In another example embodiment, the lower channel region is configured with a first fin portion of the fin structure comprising a first semiconductor material (e.g., SiGe), and the upper channel region is configured with a second fin portion of the fin structure comprising a second semiconductor material (e.g., silicon) that is compositionally different from the first semiconductor material. Numerous variations and permutations will be apparent.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Architecture

FIG. 1a illustrates a cross-section view of an integrated circuit structure including a stacked transistor configuration having gate-to-gate isolation via a selective deposition structure, in accordance with an embodiment of the present disclosure. The stacked transistor configuration includes upper devices and lower devices, formed on the same fin structure. As can be seen, the cross-section is taken parallel to, and through, the fin structure, such that the channel, source, and drain regions are shown. This particular cross-section includes three channel regions along with a source region and a drain region, but any number of channel regions and corresponding source and drain regions can be included, as will be appreciated. Further note that all transistors shown in this example are contacted, but other examples may include dummy devices or devices that are not connected into the overall circuit. The semiconductor bodies 101a included in the channel regions of the upper and lower transistors can vary in form, but in this example embodiment are in the form of nanoribbons. In particular, the channel regions of the lower devices in this example case each include a first set of four nanoribbons 101a, and the channel regions of the upper devices each include a second set of four nanoribbons 101a above the corresponding first set. Other examples may include fewer nanoribbons 101a per channel region (e.g., one or two), or more nanoribbons 101a per channel region (e.g., five or six). Still other embodiments may include other channel configurations, such as one or more nanowires or a fin or other semiconductor body, including both planar and nonplanar topologies. To this end, the present disclosure is not intended to be limited to any particular channel configuration or topology; rather the techniques provided herein can be used in any stacked transistor architecture where there is a relatively tight space budget between upper and lower gated channel regions and it is desired to have an isolation structure between those gated channel regions.

With further reference to FIG. 1a, the lower device region includes a source region 109 and a drain region 110, each adjacent to a gated channel region on either side. Other embodiments may not have gated channel regions to each side, such as the example case where only the channel region between source region 109 and drain region 110 is present. As can be further seen in this example, each of gate structures 116-118 wraps around each of the nanoribbons 101a in the corresponding channel region. Gate spacer 105c isolates gate structures 116-118 from contacting source region 109 and drain region 110. In other embodiments, there may be other insulator layers (e.g., interlayer dielectric) that prevent such contact, whether in addition to gate spacer 105c, or in place of gate spacer 105c. In addition, contacts 129 provide backside contact to respective gate structures 116-118, and contacts 131 provide backside contact to source region 109 and drain region 110. As can be further scene, dielectric 127 prevents contacts 129 from contacting contacts 131.

The upper device region includes a source region 113 and a drain region 114, each with a gated channel region to either side. Again, other embodiments may not have gated channel regions to each side, such as the example case where only the channel region between source region 113 and drain region 114 is present. As can be further seen in this example, each of gate structures 122-124 wraps around each of the nanoribbons 101a in the corresponding channel region. Gate spacer 105c isolates gate structures 122-124 from contacting source region 113 and drain region 114. In other embodiments, there may be other insulator layers (e.g., interlayer dielectric) that prevent such contact, whether in addition to gate spacer 105c, or in place of gate spacer 105c. In addition, contacts 125 provide frontside contact to respective gate structures 122-124, and contacts 131 provide frontside contact to source region 113 and drain region 114. As can be further seen, dielectric 112 prevents contacts 125 from contacting contacts 115. In some embodiments, lower and/or upper interconnect structures may be present, to further route signals to and/or from contacts 115, 125, 129, 131. Any number of suitable interconnects schemes can be used.

As can further be seen in FIG. 1a, isolation structure 121 prevents gate structures 116-118 from contacting gate structures 122-124, respectively. In particular, isolation structure 121 is between upper and lower gate structures and includes dielectric material, wherein the isolation structure 121 is on and conformal to a top surface of the underlying gate structure, and a bottom surface of the upper gate structure is on a top surface of the isolation structure 121. In addition, isolation structure 111 similarly prevents source region 109 from contacting source region 113, and prevents drain region 110 from contacting drain region 114. Generally speaking, the various depicted features can be formed using any number of standard or proprietary processes, except that isolation structure 121 is provided in accordance with an embodiment of the present disclosure. As previously explained above, the geometry and spacing in the channel regions where isolation structure 121 is formed are such that, if standard processing techniques are used, isolation structure 121 is susceptible to having a non-flat upper surface, as best shown in FIG. 1c. Note that isolation structure 111 is less susceptible to such issues, as standard epitaxial source and drain processing does not implicate the narrow margin/space budget encountered during gate processing, largely because channel material remains in the gate trench so that the final gate structure can be formed thereon, while material in the source and drain regions can be completely removed and replaced.

In more detail, and with reference to FIG. 1b, the distance d2 between the upper surface of the first (lower) semiconductor body 101a (e.g., uppermost nanoribbon in lower channel region) and the lower surface of the second (upper) semiconductor body 101a (e.g., bottommost nanoribbon in upper channel region) is in the range of 15 to 50 nm, according to an embodiment. Other embodiments may have different size constraints (e.g., 15 to 40 nm, 15 to 30 nm, 15 to 20 nm, 10 to 20 nm, or 10 to 60 nm). In any such cases, that relatively small space has to accommodate not only isolation structure 121 but also the top portion of the lower gate structure 117 and the bottom portion of the upper gate structure 123. Further recall that it is desirable to have the upper and lower gate structures have consistent thicknesses, within a given channel region. To this end, a selectively deposited isolation structure 121 as provided herein has a thickness that is relatively consistent, such that the thickness of isolation structure 121 between gate structures 117 and 123 varies less than 1 nm. The thickness of isolation structure 121 is indicated by distance d1 in FIG. 1b. In some embodiments, the largest thickness of isolation structure 121 between gate structures 117 and 123 is within 1-8 angstroms of the smallest thickness of isolation structure 121 between gate structures 117 and 123, with the average thickness (d1) of isolation structure 121 being in the range of, for example, 5 to 25 nm. Assuming that distance d2 is about 50 nm, this would leave about 12.5 nm of thickness for each of the upper gate structure 123 and lower gate structure 117. Other embodiments may have different dimensions. Table 1 shows some other examples including thicknesses of the features between the upper and lower nanoribbons 101a.

TABLE 1

Example Dimensions

| d2 | d1 | Gate Dielectric | Upper Gate Electrode | Lower Gate Electrode |
| --- | --- | --- | --- | --- |
| 50 nm | 5 nm | 4 nm | 21 nm | 20 nm |
| 50 nm | 8 nm | 2 nm | 20 nm | 20 nm |
| 50 nm | 17 nm | 3 nm | 15 nm | 15 nm |
| 50 nm | 17 nm | 3 nm | 15 nm | 15 nm |
| 50 nm | 21 nm | 4 nm | 12.5 nm | 12.5 nm |
| 50 nm | 30 nm | 3 nm | 8 nm | 9 nm |
| 50 nm | 35 nm | 2 nm | 7 nm | 6 nm |
| 50 nm | 24 nm | 1 nm | 12.5 nm | 12.5 nm |

TABLE 1-continued

Example Dimensions

| d2 | d1 | Gate Dielectric | Upper Gate Electrode | Lower Gate Electrode |
|---|---|---|---|---|
| 40 nm | 5 nm | 4 nm | 16 nm | 15 nm |
| 40 nm | 15 nm | 3 nm | 11 nm | 11 nm |
| 40 nm | 18 nm | 2 nm | 10 nm | 10 nm |
| 40 nm | 9 nm | 1 nm | 15 nm | 15 nm |
| 35 nm | 6 nm | 3 nm | 13 nm | 13 nm |
| 35 nm | 10 nm | 3 nm | 11 nm | 11 nm |
| 35 nm | 10 nm | 1 nm | 12 nm | 12 nm |
| 30 nm | 7 nm | 3 nm | 10 nm | 10 nm |
| 30 nm | 10 nm | 2 nm | 9 nm | 9 nm |
| 30 nm | 8 nm | 2 nm | 10 nm | 10 nm |
| 30 nm | 9 nm | 1 nm | 10 nm | 10 nm |
| 25 nm | 6 nm | 3 nm | 8 nm | 8 nm |
| 25 nm | 4 nm | 2 nm | 10 nm | 9 nm |
| 25 nm | 4 nm | 1 nm | 10 nm | 10 nm |
| 20 nm | 4 nm | 2 nm | 7 nm | 7 nm |
| 20 nm | 4 nm | 1 nm | 7 nm | 8 nm |
| 15 nm | 5 nm | 2 nm | 4 nm | 4 nm |
| 15 nm | 5 nm | 1 nm | 5 nm | 4 nm |

Note the example gate dielectric dimensions provided in Table 1 may include one or more layers, such as a layer of silicon dioxide and a layer of high-k dielectric such as hafnium oxide or zirconium oxide. Recall that if the gate dielectric is only a single layer, that dielectric may be regular or high-k.

In contrast, and with reference to FIG. 1c, a gate isolation layer formed by a non-selective deposition of dielectric material followed by an etch process to remove excess dielectric material will tend to provide a gate isolation structure 126 that has a topology that is conformal to the etch process rather than the underlying gate structure 117. In particular, gate isolation structure 126 has a non-flat upper surface and thus there is a non-trivial variability in the thickness of that gate isolation structure 126. This variability is generally designated in FIG. 1c as Δ (delta thickness) and is greater than 1 nm. The severity of the variability depends on a number of factors, including the distance d2 (in the y-dimension), as well as the length of the semiconductor bodies 101a (in the x-dimension) and the width of the semiconductor bodies 101a (in the z-dimension). It is believed that the smaller these dimensions, the more difficult it becomes for an isotropic etch to remove excess dielectric material. Hence, a peak of dielectric material remains in location(s) that are less accessible to the etchant. In some embodiments, the thickness variability Δ is in the range of 2 to 5 nm, which in turn causes the thickness of gate structure 123 to vary in a similar fashion.

With further reference to the example embodiment of FIG. 1a, the dielectric material of the isolation structure 121 may include any number of dielectrics that can be selectively deposited, including oxides, nitrides, carbides, oxynitrides, oxycarbides, and oxycarbonitrides. In some example embodiments, isolation structure 121 includes silicon, and one or more of oxygen, carbon, and nitrogen (e.g., silicon oxycarbide, or silicon oxycarbonitride). In any such cases, the isolation structure 121 can be selectively deposited such that it only attaches to the exposed top surface of the underlying gate structure 117, rather than any exposed dielectric materials. The deposition can be timed, such that no excess dielectric material is deposited, and thus, no subsequent etch to remove excess material is needed, according to an embodiment. The isolation structure 111 can be the same material as isolation structure 121, but need not be. In one example embodiment, isolation structure 111 is silicon dioxide, and isolation structure 121 is silicon oxycarbide.

Each of gate structures 116-118 and 122-124 can be formed via gate-first or gate-last processing, and may include any number of suitable gate materials and configurations. In an embodiment, each of the gate structures 116-118 and 122-124 includes a gate electrode and a gate dielectric between the gate electrode and the corresponding semiconductor body 101a. Gate spacers 105c may also be considered part of the gate structures, as will be appreciated in light of this disclosure. The gate spacers 105c may be, for example, silicon nitride or silicon dioxide or a carbon-doped oxide or an oxynitride or a carbon-doped oxynitride. The gate dielectrics (shown with thick bolded lines) may be any suitable gate dielectric material(s), such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some example embodiments, an annealing process may be carried out to improve gate dielectric quality when a high-k material is used. Further, the gate electrodes (shown with cross-hatching) may comprise a wide range of suitable metals or metal alloys, such as aluminum, tungsten, cobalt, ruthenium, molybdenum, titanium, tantalum, copper, titanium nitride, or tantalum nitride, for example.

In some embodiments, the gate dielectrics and/or gate electrodes may include a multilayer structure of two or more material layers or components. For instance, in one such embodiment, the upper and/or lower gate dielectrics can be a bi-layer structure having a first dielectric material (e.g., silicon dioxide) in contact with the corresponding channel region 101a and a second dielectric material (e.g., hafnium oxide) in contact with the first dielectric material. Likewise, the upper and/or lower gate electrodes may include a central metal plug portion (e.g., tungsten, cobalt, molybdenum, ruthenium) with one or more outer workfunction layers (e.g., titanium nitride for PMOS workfunction, or an aluminum-containing alloy such as titanium aluminum carbide for NMOS workfunction) and/or barrier layers (e.g., tantalum nitride), and/or a resistance reducing cap layer (e.g., cobalt). In some embodiments, the gate dielectrics and/or gate electrodes may include concentration grading (increasing or decreasing) of one or more materials therein.

Further note that the gate structures of the upper devices may be the same as the gate structures of the lower devices, or different. In some example embodiments, for instance, the gate dielectrics are the same for both upper and lower gate structures, but the gate electrodes of the upper gate structures include an n-type workfunction metal suitable for NMOS devices (e.g., titanium aluminum nitride), while the gate electrodes of the lower gate structures include a p-type work function metal suitable for PMOS devices (e.g., titanium nitride), or vice-versa. Likewise, the gate dielectric of the upper gate structures may be compositionally different from the gate dielectric of the lower gate structures. In addition, or alternatively, the gate dielectric of the upper gate structures may have a first thickness, while the gate dielectric of the lower gate structures has a second thickness that is different from the first thickness. For instance, the relatively thicker gate dielectric may be used for a high voltage transistor device, while the relatively thinner gate dielectric may be used for a logic transistor device. Numerous gate structure configurations can be used along with the techniques provided herein, and the present disclosure is not intended to be limited to any particular such configurations.

Likewise, numerous source and drain configurations can be used, and the present disclosure is not intended to be limited to any particular ones. In some example embodiments, the source and drain regions 109-110 and 113-114 are epitaxial source and drain regions that are provided after the relevant portion of the fin or fin structure was isolated and etched away or otherwise removed. In other embodiments, the source/drain regions may be doped portions of the fin structure or substrate, rather than epi regions. In some embodiments using an etch and replace process, the epi source and drain regions 109-110 and 113-114 are faceted and overgrown from a trench within insulator material (e.g., shallow trench isolation, or gate spacer 105c that deposits on the sides of the fin structure in the source and drain locations), and the corresponding source or drain contact structure lands on that faceted portion. Alternatively, in other embodiments, the faceted portion of epi source and drain regions can be removed (e.g., via chemical mechanical planarization, or CMP), and the corresponding source or drain contact structure lands on that planarized portion.

The source and drain regions 109-110 and 113-114 can be any suitable semiconductor material and may include any dopant scheme. For instance, source and drain regions 109-110 may be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions 113-114 can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, source and drain regions 109-110 are boron-doped SiGe, and source and drain regions 113-114 are phosphorus-doped silicon. In a more general sense, the source and drain regions can be any semiconductor material suitable for a given application.

In some cases, the epi source and drain regions may include a multilayer structure, such as a germanium cap on a SiGe body, or a germanium body and a carbon-containing SiGe spacer or liner between the corresponding channel region and that germanium body. In any such cases, a portion of the epi source and drain regions may have a component that is graded in concentration, such as a graded germanium concentration to facilitate lattice matching, or a graded dopant concentration to facilitate low contact resistance. Any number of source and drain configurations can be used as will be appreciated, and the present disclosure is not intended to be limited to any particular such configurations.

The semiconductor bodies 101a, which in this case are nanoribbons, can be any number of semiconductor materials as well, such as group IV material (e.g., silicon, germanium, or SiGe) or group III-V materials (e.g., indium gallium arsenide). In other embodiments, the semiconductor bodies 101a may be fins on which the corresponding gate structures are formed to provide double-gate or tri-gate configurations (as opposed to gate-all-around configurations with nanoribbons or wires). The semiconductor bodies 101a may be lightly doped, or undoped, and may be shaped or sculpted during the gate formation process, according to some embodiments. In some cases, semiconductor bodies 101a may be a multilayer structure, such as a SiGe body cladded with germanium, or a silicon body cladded with SiGe. Any number of channel configurations can be used.

The contacts 115, 125, 129, and 131 can have any number of configurations. In some example embodiments, the contacts 115, 125, 129, and 131 include a contact metal and a conductive liner or barrier layer, deposited in a contact trench formed in an insulator layer (e.g., dielectric layers 112 and 127, such as silicon dioxide) over the source and drain regions. The liner can be, for example, tantalum or tantalum nitride, and metal can be any suitable plug/core material, such as tungsten, aluminum, ruthenium, molybdenum, cobalt, titanium, copper, or alloys thereof. In some cases, the contacts 115, 125, 129, and 131 can be optimized p-type and n-type similar to p-type and n-type gate electrodes. For instance, according to some such embodiments, the liner can be titanium for NMOS source/drain contacts, or nickel or platinum for PMOS source/drain contacts. In still other embodiments, the contacts 115, 125, 129, and 131 may include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact metal and any liner. Other embodiments may be configured differently. In a more general sense, any number of suitable source/drain contact can be used in accordance with an embodiment of the present disclosure, as will be appreciated, and the present disclosure is not intended to be limited to any particular such contact configurations.

Methodology

FIG. 2 illustrates a cross-section view of a multilayer substrate 101 that can be used to form a stacked transistor configuration having gate-to-gate isolation via a selective deposition structure, in accordance with an embodiment of the present disclosure. Distance d3 can be set or otherwise adjusted to provide a desired distance between upper and lower channel regions, so as to leave sufficient room for formation of the selective isolation structure, according to some embodiments. Each layer can be formed by deposition (e.g., chemical vapor deposition, atomic vapor deposition, physical vapor deposition) or layer transfer or other suitable process. Alternatively, substrate 101 can be purchased or otherwise preformed in advance of the process (e.g., multilayer wafer).

As can be seen, the substrate 101 includes alternating layers of material 101a and 101b. Both layer materials can be semiconductor materials, such as alternating layers of silicon (e.g., 101a) and SiGe (e.g., 101b), according to some embodiments. In other embodiments, one material can be a sacrificial dielectric material, such as alternating layers of silicon (e.g., 101a) and silicon dioxide (e.g., 101b). In still other embodiments, substrate 101 may include alternating layers of silicon (e.g., 101a) and SiGe (e.g., 101b), and further include a middle layer 101c of an insulator material such as silicon dioxide. In any such cases, the alternating materials making up layers 101a and 101b (and 101c, if present) can be selectively etched with respect to one another, so that a sacrificial one of the materials can be selectively etched away so as to liberate the other material to provide nanoribbons or wires, according to some embodiments. In other embodiments, the substrate 101 may include a relatively thick top semiconductor layer 101a and a relatively thick bottom semiconductor layer 101a separated by a dielectric layer 101b (or 101c), which could be used to form upper and lower fin portions suitable for stacked double-gate transistors or tri-gate transistors.

The resulting stack as well as the individual layers can have any number of thicknesses, and are not necessarily drawn to scale. For instance, in some such example embodiments, each of the layers 101a and 101b are in the range of 5 to 100 nm thick, except the bottommost layer 101a may be a relatively thicker layer or bulk substrate, and the middle layer 101b has a thickness d3 that can be varied to set the working distance between the upper and lower channel regions, such as 10 to 60 nm or 15 to 50 nm or 15 to 40 nm or 15 to 30 nm, according to some embodiments. In a more general sense, each of the one or more layers making up substrate 101 may be set to any suitable thickness as will be appreciated.

Figure 3A:
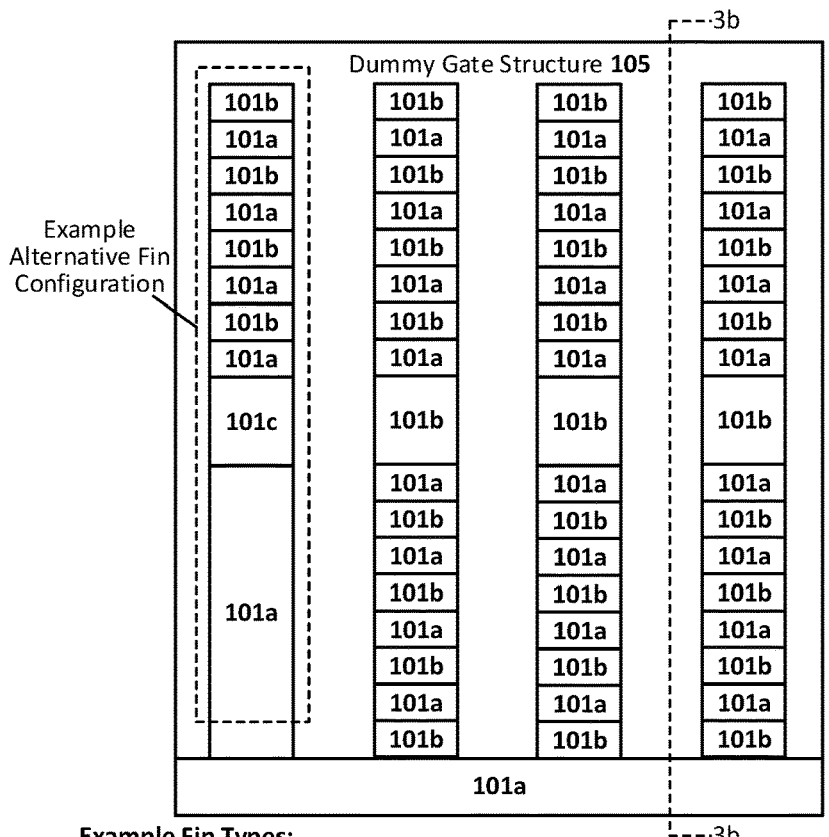

FIG. 3a shows the resulting structure after substrate 101 has been patterned and etched to form a number of multi-layer fin structures, and a dummy gate structure 105 has been formed thereon, according to an embodiment. The cross-section is taken parallel to, and through, dummy gate structure 105. As can be seen, four fin structures are shown, but any number of such fin structures can be made. The fin structure on the far left shows an alternative fin configuration, where the bottom portion of the fin structure is configured for fin-based channel regions and the top portion of the fin structure is configured with nanoribbon-based channel regions. An insulator layer 101c (e.g., silicon dioxide) is provided between the upper and lower portions. Such an insulator layer 101c may also be substituted for the mid-layer 101b having the thickness of d3, in the example multilayer fins to the right. As will be discussed in turn, such a native insulator structure 101c (native to the substrate) can be used to separate upper source and drain regions from lower source and drain regions, in cases where the upper source and drain regions are provided by topside processing and the lower source and drain regions are provided by bottomside processing. If both upper and lower source and drain regions are formed from the same side (e.g., topside), then any such a native mid-layer would be etched away and replaced between lower and upper source/drain region forming processes. Numerous other configurations can be used, as will be appreciated. To this end, the present disclosure is not intended to be limited to nanoribbons or any particular fin structure, even though the figures are primarily focused on nanoribbons. The techniques provided herein can be used with planar transistor technologies as well, as will be appreciated in light of this disclosure.

Figure 3B:
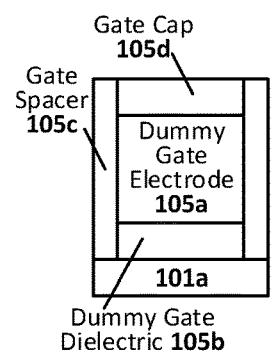
Figure 3C:
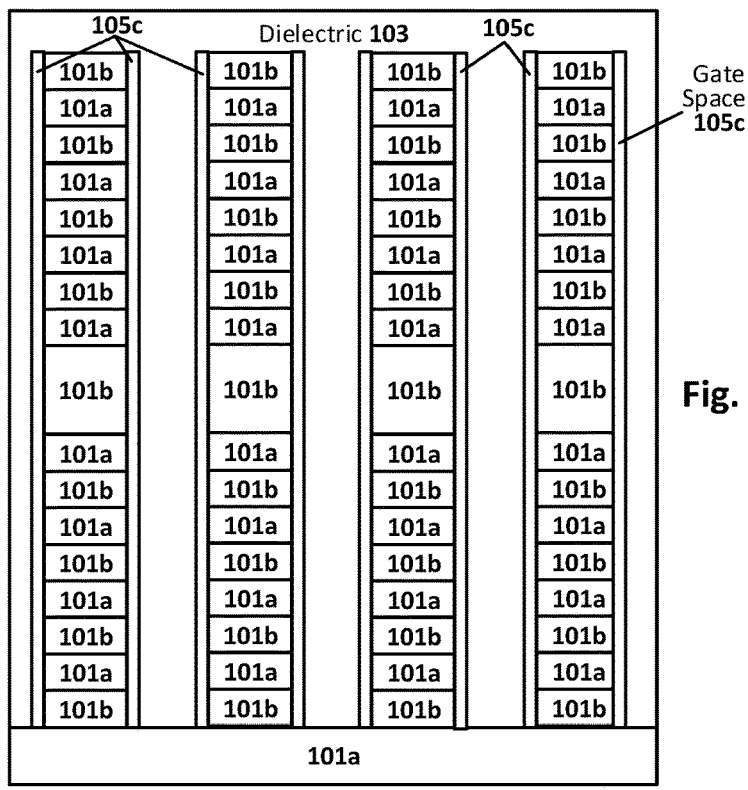

The dummy gate structure 105 can be any standard or proprietary gate structure. According to an embodiment, the dummy gate structure 105 is formed by a blanket deposition of the dummy gate material(s) followed by a masking and etch to remove the excess gate material(s), such that the dummy gate structure 105 only remains across the channel regions of the fins. The configuration of the dummy gate structure 105 can vary from one embodiment to the next, but in some embodiments includes amorphous silicon, and in still other embodiments such as best shown in FIG. 3b includes a dummy gate electrode 105a (e.g., polysilicon), a dummy gate dielectric 105b (e.g., an oxide of the channel material 101a or 101b), and a gate spacer 105c (e.g., silicon oxycarbonitride, or other material that is etch selective with respect to other the dummy gate material or materials). Note that the cross-section of FIG. 3b is taken perpendicular to, and through, the dummy gate structure 105, at dashed line 3b-3b indicated in FIG. 3a. A gate cap may also be provided on top of the dummy gate structure 105, to protect the dummy gate structure during subsequent source and drain processing, and can be any number of materials, such as silicon nitride. Once the dummy gate structure 105 is formed, dielectric 103 is deposited (e.g., CVD) and planarized down to the top of the dummy gate structure (or gate cap) using a CMP process, as best shown in FIG. 3c. Dielectric 103 can be any number of dielectrics, such as those that have etch selectivity to gate spacers 105c. So, for instance, dielectric 103 can be an oxide such as silicon dioxide, and spacers 105c can be a nitride or carbide such as silicon nitride, silicon oxynitride, or silicon oxycarbonitride. Like FIG. 3a, the cross-section of FIG. 3c is taken parallel to dummy gate structure 105, but through the portion of the fin structures where the source or drain regions will be formed.

The dimensions of the dummy gate structure 105 can vary from one embodiment to the next, as will be appreciated. In some example cases, the distance from the top of a given fin to the top of the dummy gate structure 105 is in the range of 50 to 100 nm (e.g., 75 nm). The width of the dummy gate structure 113 will also vary, depending on factors such as desired channel length and/or fin thickness (for non-planar transistors), but in some cases is in the range of 10 to 100 nm. If present, the thickness of the gate cap may be, for example, in the range of 20 to 100 nm (e.g., 30 to 75 nm). If present, a dummy gate dielectric 105b may have a thickness in the range of, for example, one or more monolayers to 10 nm. The gate spacers 105c, when present, can be conformally deposited and have any desired thickness, such as in the range of 3 to 40 nm. As will be explained in turn, the gate spacer 105c may be conformally deposited in a blanket fashion so as to also cover the exposed sidewalls of fin portions where the source and drain regions will be formed, and thus can subsequently be used as a guide in an epitaxial source and drain formation process.

Figure 4:
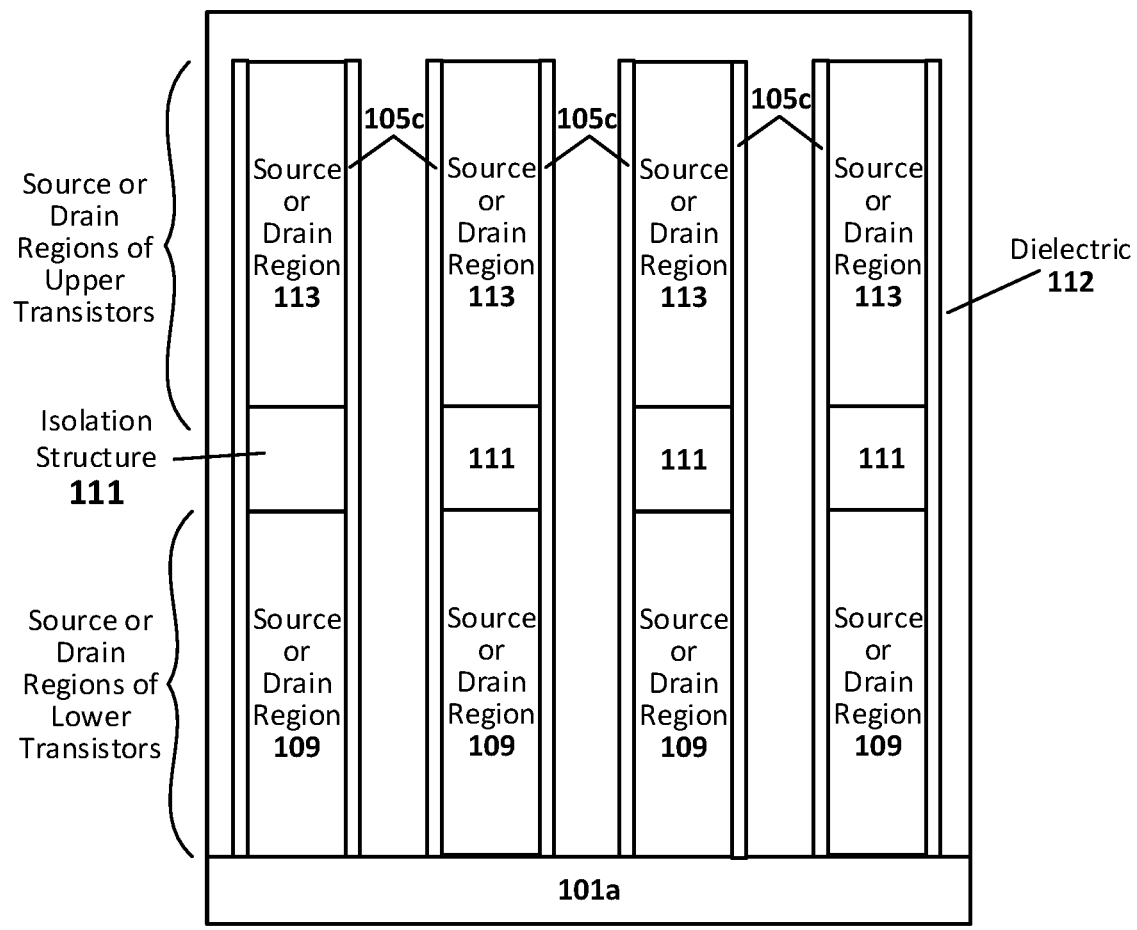

FIG. 4 is the cross-sectional view of the structure of FIG. 3c after the lower source or drain regions 109 and upper source or drain regions 113 have been formed, along with isolation structure 111, in accordance with an embodiment. Like FIG. 3c, the cross-section of FIG. 4 is taken parallel to dummy gate structure 105, but through the portion of the fin structures where the source or drain regions are formed. As previously explained, source or drain regions 109 and 113 can be formed using any standard or proprietary source and drain processing method. In this example case, source or drain regions 117 and 119 are formed by an etch and replace process, where original fin material is etched away and replaced via epitaxial deposition of the desired source and drain materials. As can be seen, gate spacer 105c can be used as a guide during the epitaxial growth of the source or drain regions 109 and 113, which constrains faceting of source or drain regions 109 and 113. In some example embodiments, source or drain regions 109 are PMOS source or drain regions (e.g., epitaxial SiGe doped with boron), and source or drain regions 113 are NMOS source or drain regions (e.g., epitaxial silicon doped with phosphorus), so as to provide complementary MOS (CMOS) logic or memory cells. The previous discussion with reference to example source and drain materials, configurations and forming methods is equally applicable here.

In this example embodiment, the source or drain regions 109 and 113 are formed from the topside of the structure using a sequential deposition and etch process such as: etch away the fin structure in both the upper and lower source/drain regions; epitaxially deposit source or drain regions 109 and etch away any excess deposition; deposit isolation structure 111 and etch away any excess deposition; and epitaxially deposit source or drain regions 113 and etch away any excess deposition. In other embodiments, the upper source or drain regions 113 can be formed from the topside, while the lower source or drain regions 109 can be formed from the backside after the bottommost substrate 101a portion has been removed. In such cases, isolation structure 111 can be provisioned at an appropriate point in that processing, such as between etching away the portion of the fin structure in the upper source/drain regions and epitaxially depositing source or drain regions 113, or between etching away the portion of the fin structure in the lower source/drain regions and epitaxially depositing source or drain regions 109. In still other examples that utilize topside processing to form source or drain regions 113 and bottomside processing to form source or drain regions 109, isolation structure 111 can be built into or otherwise native the fin structure, such as 101c which can be, for instance, an oxide layer. In such cases, the etching away of the fin structure from topside and bottomside directions can be stopped once the isolation structure 111 is reached. The dielectric of isolation structure 111 and dielectric 112 can be, for example, the same dielectric material as used for dielectric 103 (e.g., silicon dioxide), but need not be.

Figure 5:
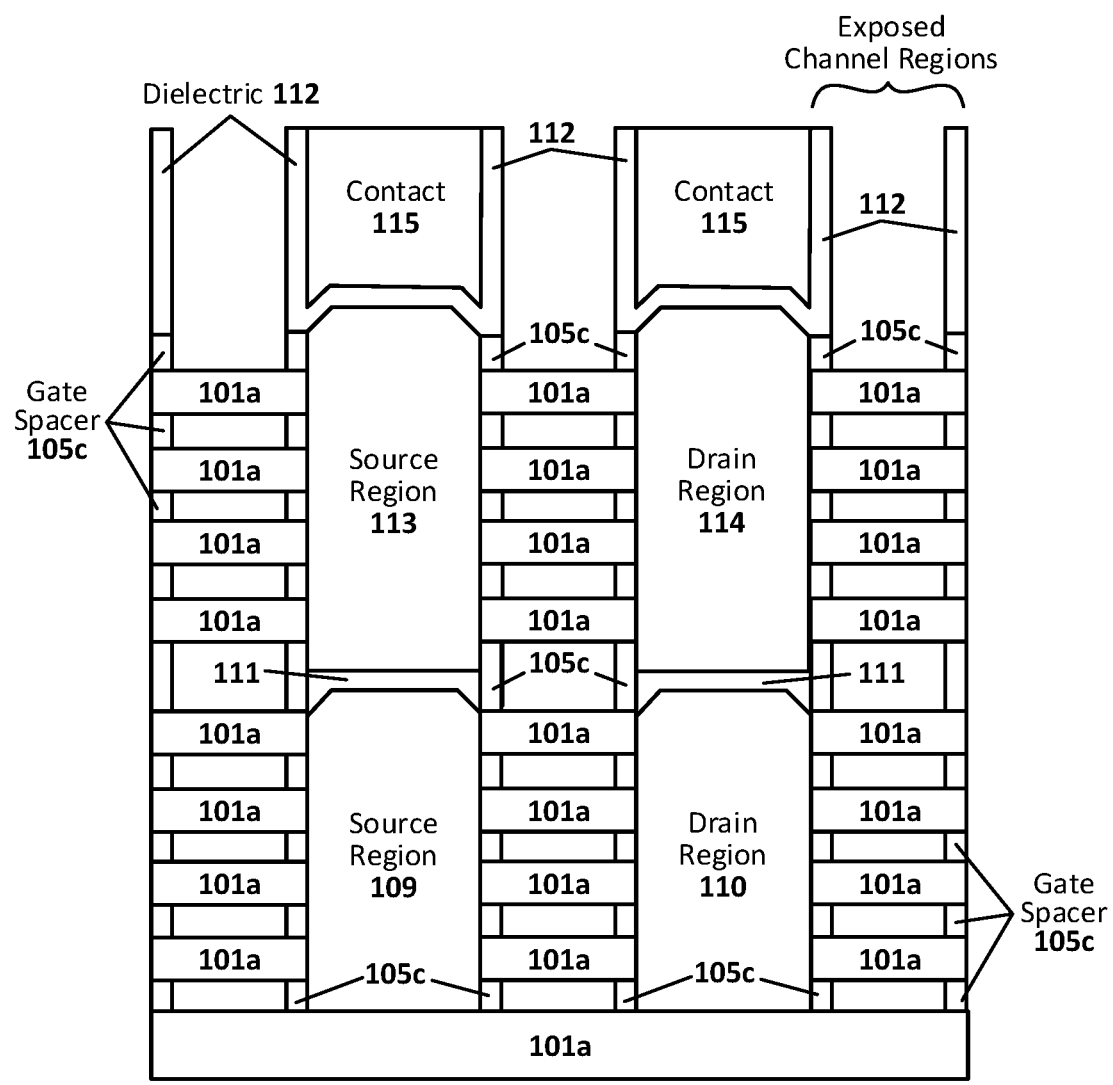

FIG. 5 is the cross-sectional view of the structure of FIG. 4 after contacts 115 have been formed over upper source or drain regions 113, dummy gate structure 105 has be removed, and nanoribbons 101a have been released by selectively etching away sacrificial material 101b, in accordance with an embodiment. Here, the cross-section is taken parallel to, and through, one of the fin structures, so as to show source, channel, and drain regions of upper and lower transistors. Note the source and drain regions 109, 110, 113, and 114 are depicted in this example case with some faceting. Other embodiments may not include such faceting, or may include a higher degree of faceting. Contacts 115 can be any suitable contact configuration, and the previous relevant discussion is equally applicable here. As also previously explained, that nanoribbon release process can be, for example, part of a gate forming process where the channel region is first exposed by removing any dummy gate materials (if a gate-last process is used), followed by an etch that is selective to the semiconductor 101a and not the sacrificial material 101b (i.e., the etch removes the sacrificial material 101b at a much higher rate than the semiconductor 101a material). Note that the source or drain regions can be masked off or otherwise protected during this gate processing. Any number of selective etch schemes can be used, as will be appreciated. For instance, in one example embodiment, sacrificial material 101b is silicon and semiconductor material 101a is germanium or SiGe, and etch chemistries such as aqueous hydroxide chemistries, including ammonium hydroxide and potassium hydroxide, for example, may be utilized to selectively etch the silicon 101b but leave the germanium-containing nanowires or nanoribbons 101a in place. In another example embodiment, sacrificial material 101b is germanium-containing material and semiconductor material 101a is silicon, and etch chemistries such as carboxylic acid/nitric acid/hydrogen fluoride chemistry, and citric acid/nitric acid/hydrogen fluoride, for example, may be utilized to selectively etch the germanium-containing material 101b but leave the silicon 101a in place. Any number of material systems and selective etch schemes can be used, as will be appreciated.

Figure 6:
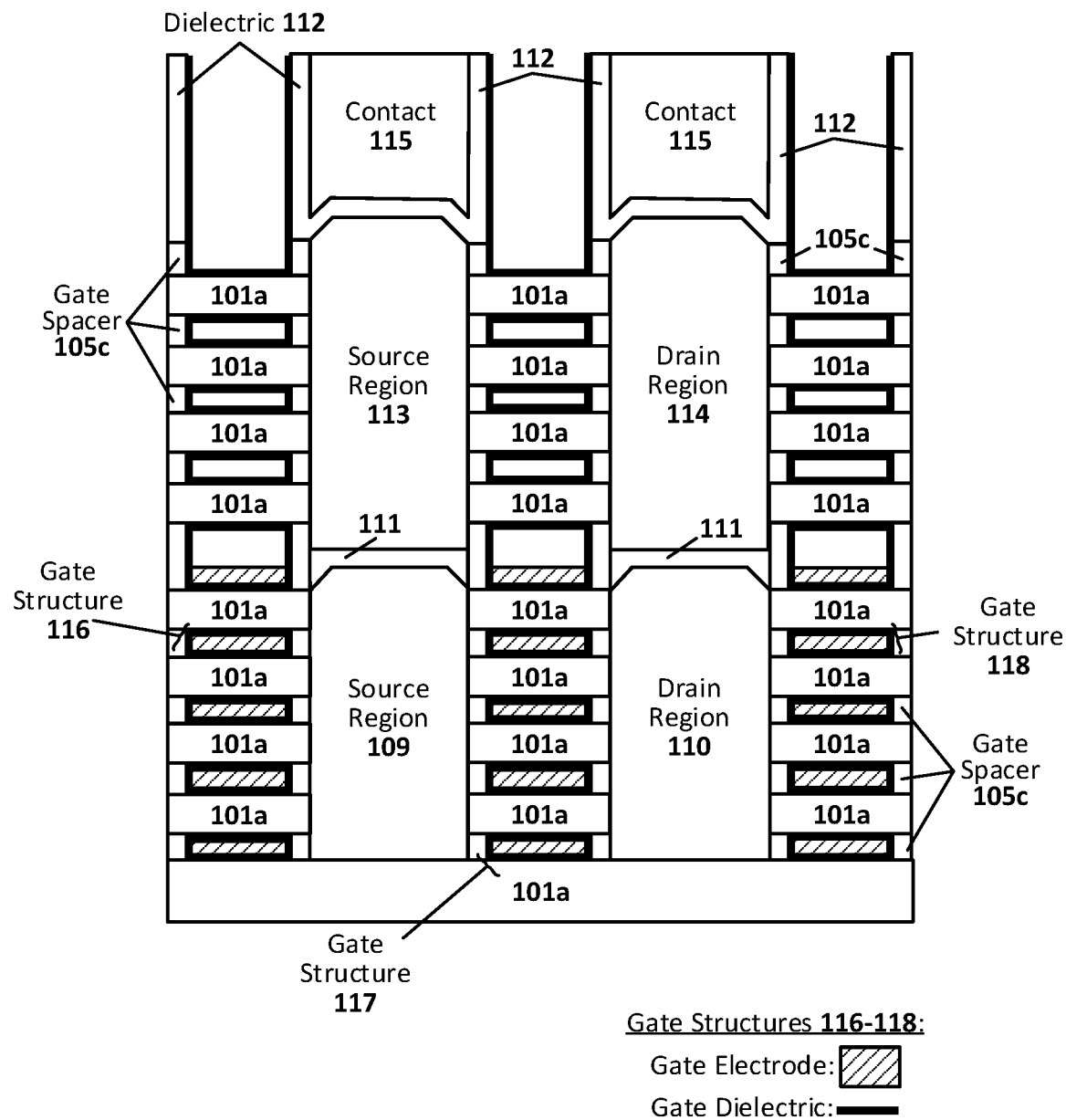

FIG. 6 is the same cross-sectional view of the structure of FIG. 5, after lower gate structures 116-118 have been formed, in accordance with an embodiment. Standard gate structure deposition techniques can be used. As can be seen, each gate structure 116-118 includes a gate dielectric (shown with thick bolded lines) and a gate electrode (shown with cross-hatching). In the example embodiment shown, the gate dielectric deposition is non-selective, in that the gate dielectric is deposited on exposed surfaces within the gate trench. CVD or ALD can be used to provide the gate dielectric at a desired thickness, such as a thickness in the range of, for example, one or more monolayers to 10 nm. In this embodiment, the gate dielectric is the same for both upper and lower gate structures, but it need not be. The gate electrode is then deposited onto the gate dielectric. Note that the lower gate electrode material(s) will also be deposited onto the upper device region channel regions, as well as may the gate dielectric, which is okay as such excess gate materials can be subsequently etched back or otherwise removed via a subsequent etch process, as shown in FIG. 6. A mask (e.g., carbon hardmask) may be used to protect the underlying lower gate structure while etching away the excess gate materials to re-expose the upper channel region. Once the excess gate material is removed, the mask can also be removed using a standard mask removal etch (e.g., ash-based etch to remove carbon hardmask). The previous relevant discussion with respect to gate dielectrics and gate electrodes is equally applicable here, as will be appreciated. In the embodiment shown, note that the gate dielectric can be left on the upper device channel regions and may include, for instance, silicon dioxide and/or a high-k dielectric material; other embodiments may have the gate dielectric on the upper channel regions removed.

Figure 7:
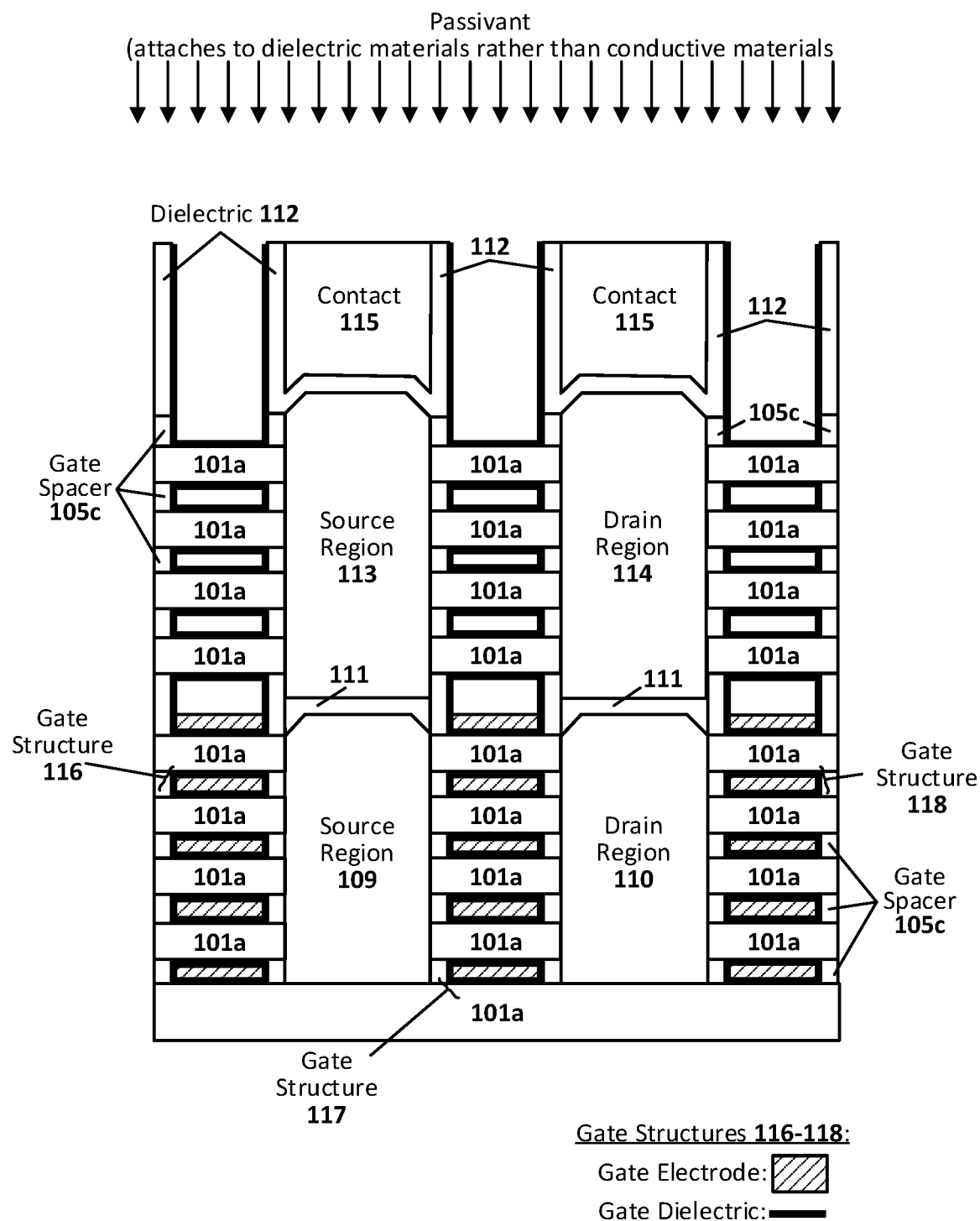

Once the lower gate structures 116-118 are formed, the structure is subjected to a selective passivation process, as shown in FIG. 7, according to an embodiment. In some such cases, the passivant attaches to any exposed dielectric materials, such as the gate dielectric (if present), gate spacer 105c, and dielectric 112, rather than any exposed conductive materials such as the material(s) of the gate electrodes of lower gate structures 116-118. The passivant may also attach to any exposed semiconductor material of the channel regions, such as nanoribbons 101a, if they are not covered by the gate dielectric, according to some embodiments. The passivant can be, for example, any number of small molecule passivants, such as amino silane. In some such cases, the passivant will only attach to the OH-terminated surfaces of silicon-based materials exposed in the gate trench, such as silicon or SiGe nanoribbons 101, and silicon nitride or silicon oxycarbide gate spacer 105c, and silicon dioxide gate dielectric (if present). The passivant will not, however, attach to the top surfaces of gate structures 116-118. In some embodiments, more than one passivant may be used. Further details of passivation process and example passivation materials are provided with reference to FIG. 12. The thickness of the passivation layer(s) is relatively thin and in some example cases is on the order of 2 to 10 monolayers. Depending on the chain length of the molecule, this can range between a few angstroms to a couple of nanometers, according to some embodiments.

Figure 8:
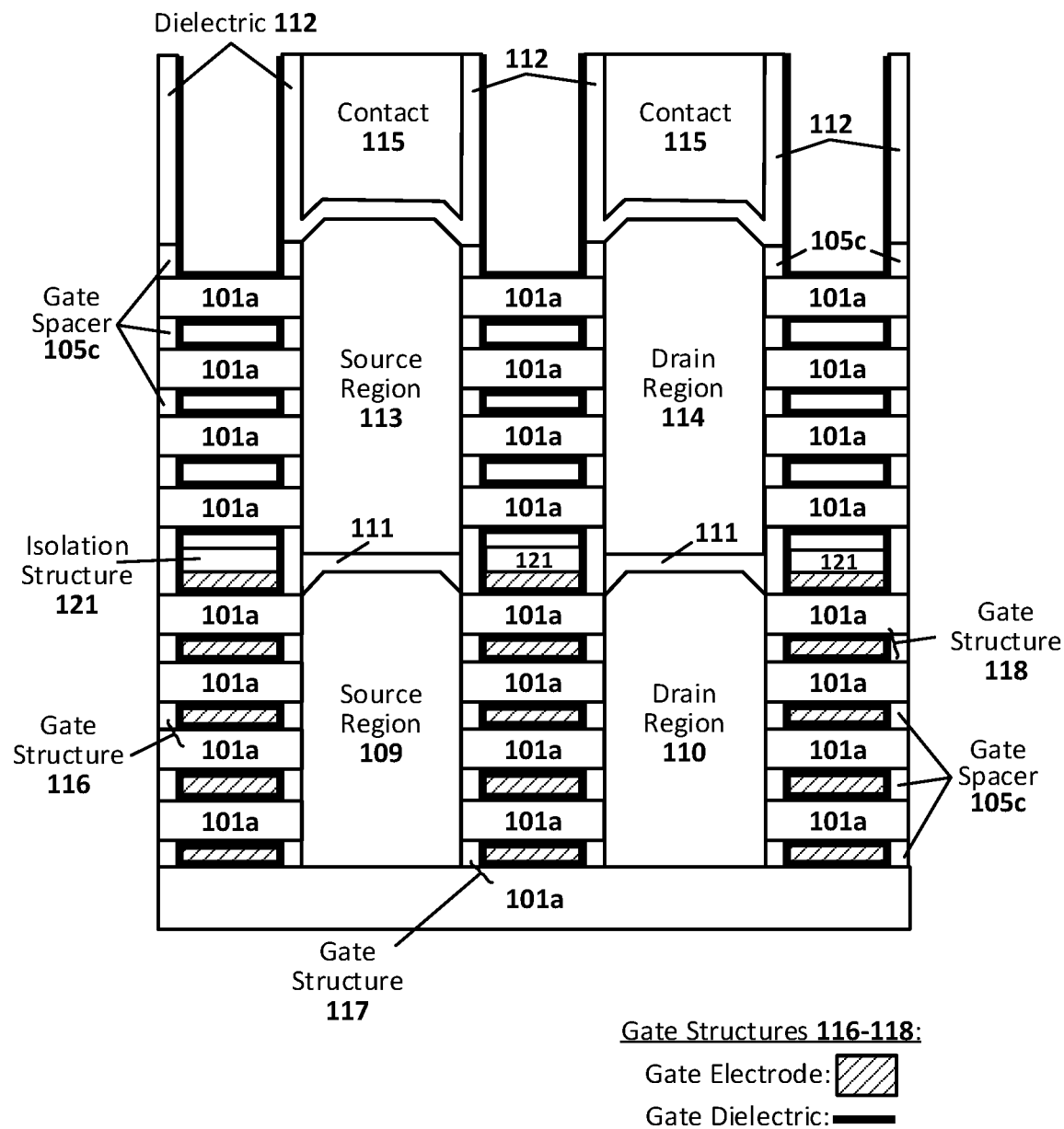

The benefit of the passivant is that the subsequently deposited isolation structures 121 will only deposit on the exposed top surfaces of gate structures 116-118, thereby providing the gate-to-gate isolation. In this sense, the passivant allows for an area-selective deposition of isolation structure 121, as shown in FIG. 8, according to an embodiment of the present disclosure. Such selective deposition allows the isolation structure 121 to be self-aligned, as will be appreciated. Moreover, no etch back of the gate isolation structure material is needed, and as such the isolation structures 121 remain conformal to the underlying gates structures 116-118 and each have a substantially flat top surface. In one example embodiment, the isolation structures 121 are silicon oxycarbide or silicon oxynitride. The previous relevant discussion with respect to example materials, dimensions, and other features of selectively deposited isolation structures 121 is equally applicable here.

Figure 9:
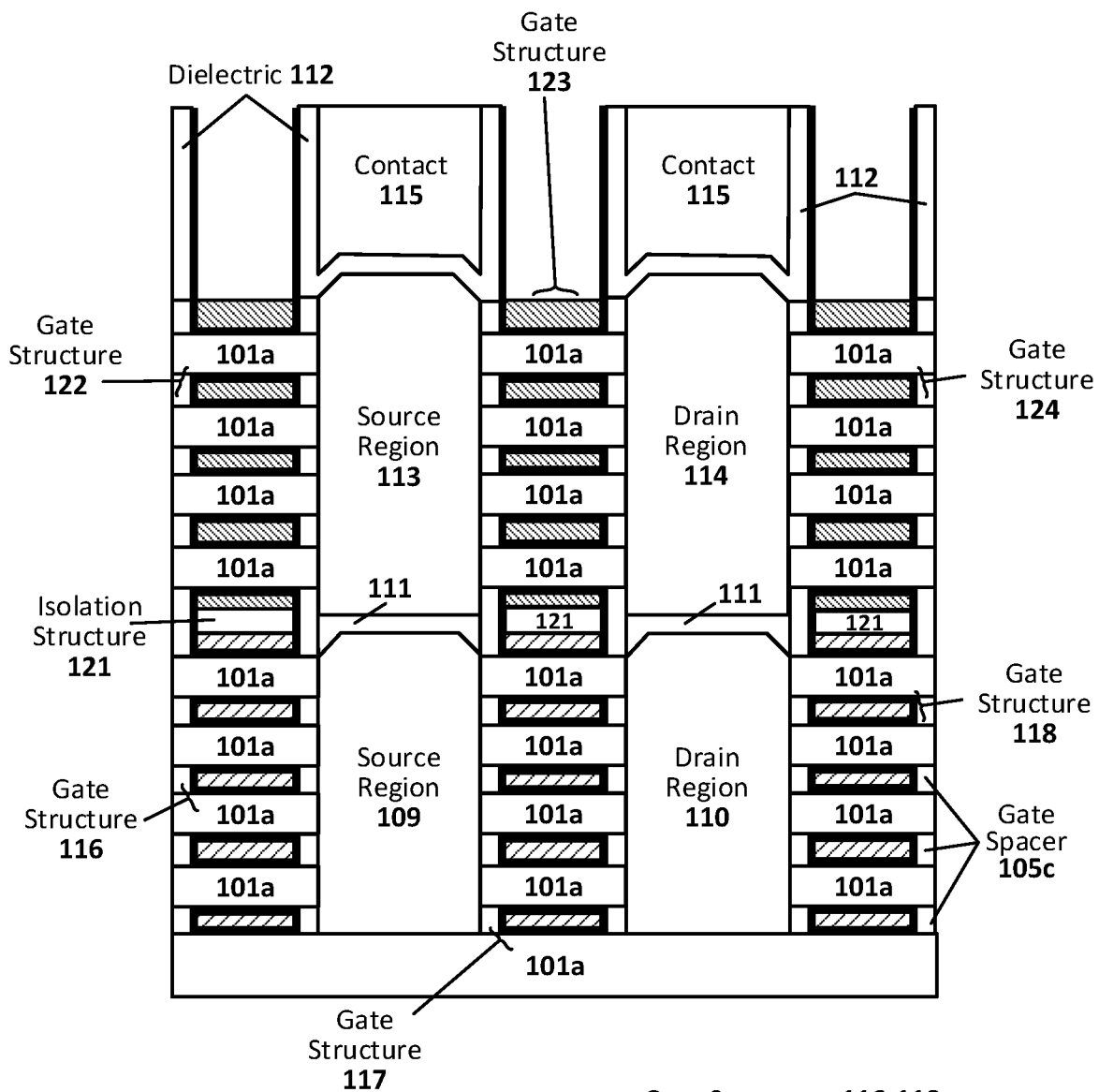

FIG. 9 is the same cross-sectional view of the structure of FIG. 8, after the passivation layer has been removed, after upper gate structures 122-124 have been formed, in accordance with an embodiment. The passivation layer can be removed, for example, by thermal desorption and/or isotropic etch. In some embodiments, a light ash treatment with hydrogen/argon or forming gas source (e.g., 5% hydrogen in balance of nitrogen) will remove the passivant. Alternatively, an SC1 pre-treatment (e.g., a solution containing ammonia, peroxide, and water) can be used remove the passivant. With the passivation layer removed, standard gate structure deposition techniques can be used. As can be seen, each gate structure 122-124 includes a gate dielectric (shown with thick bolded lines) and a gate electrode (shown with cross-hatching). Note that the upper gate dielectric that deposited during the lower gate structure processing may be etched away and reapplied, to improve quality of the upper gate dielectric. The gate electrode is then deposited onto the gate dielectric. The previous relevant discussion with respect to gate dielectrics and gate electrodes is equally applicable here, as will be appreciated.

Figure 10:
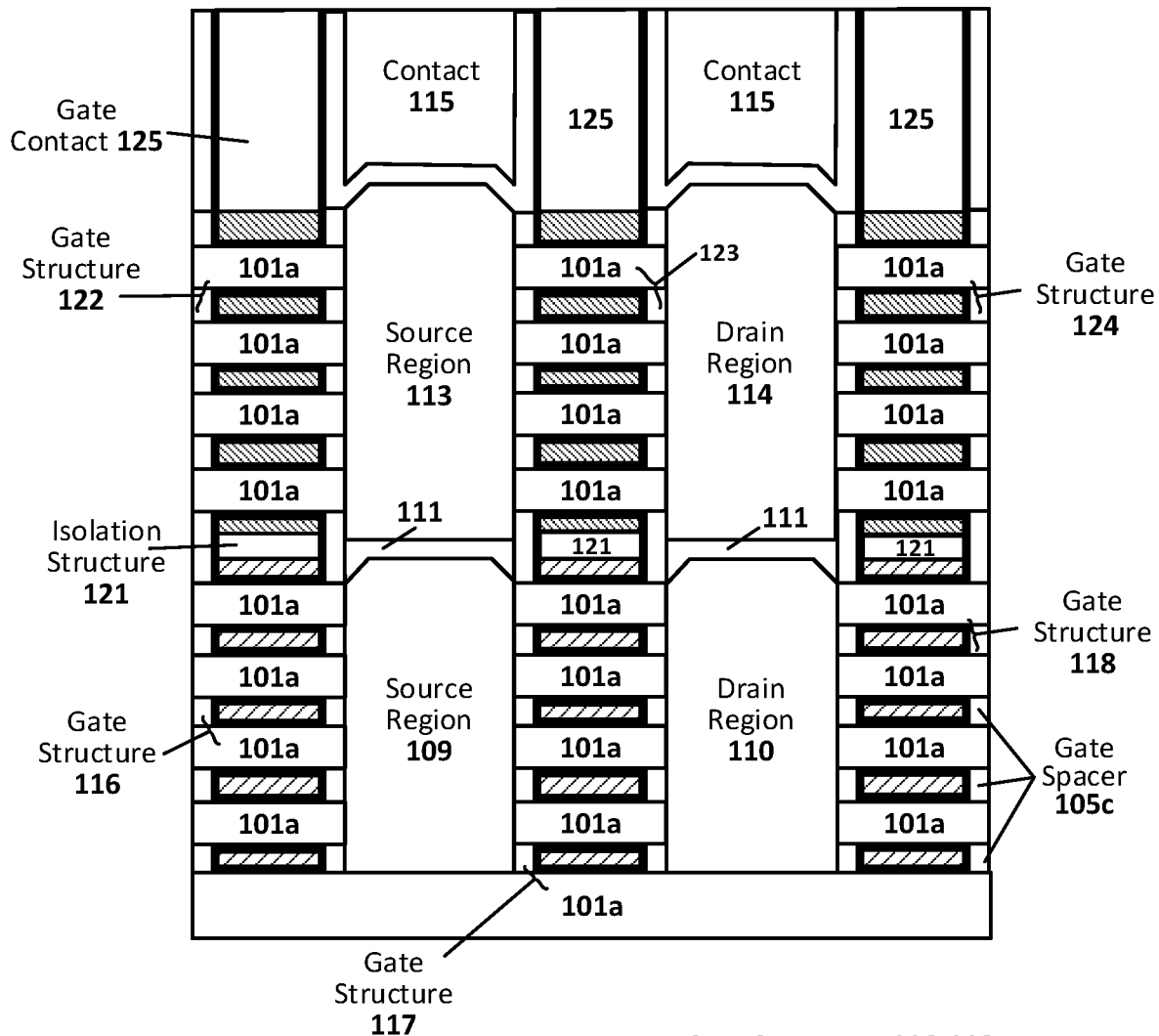

FIG. 10 is the same cross-sectional view of the structure of FIG. 9, after gate contacts 125 have been formed, in accordance with an embodiment. Standard contact deposition techniques can be used. Note that excess gate dielectric (thick bolded lines) can be removed via etch process, in some embodiments. The previous relevant discussion with respect to contacts is equally applicable here, as will be appreciated.

Figure 11A:
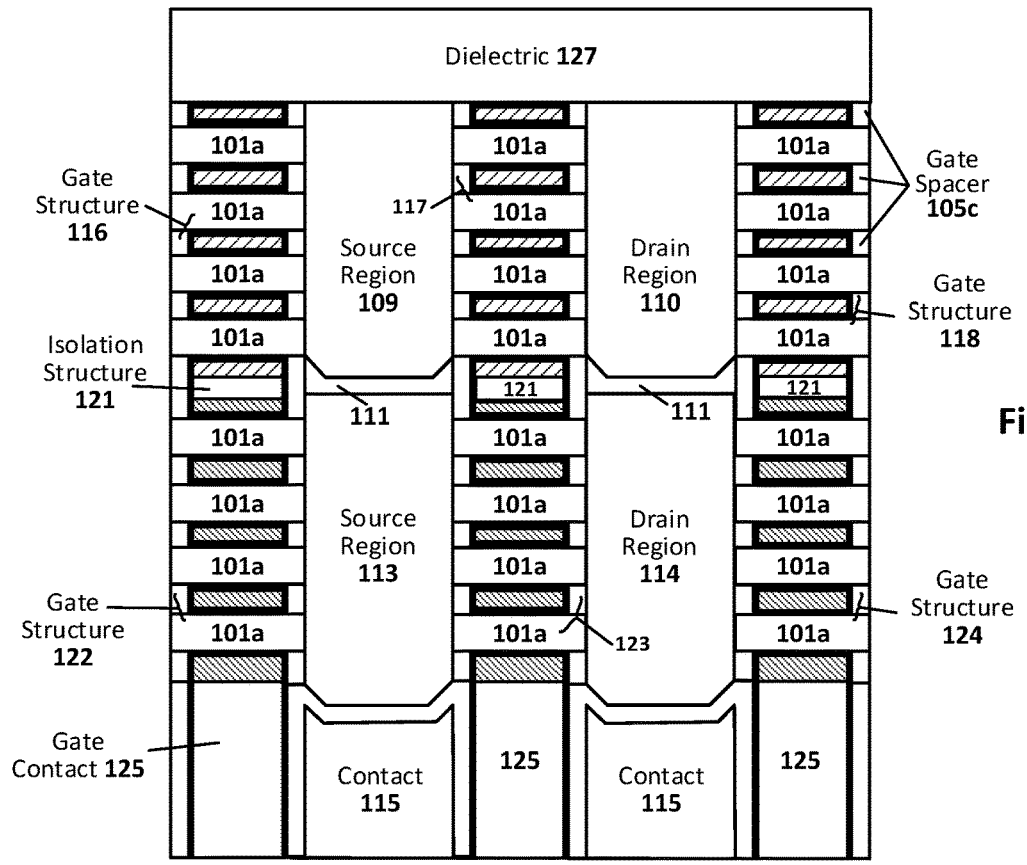
Figure 11B:
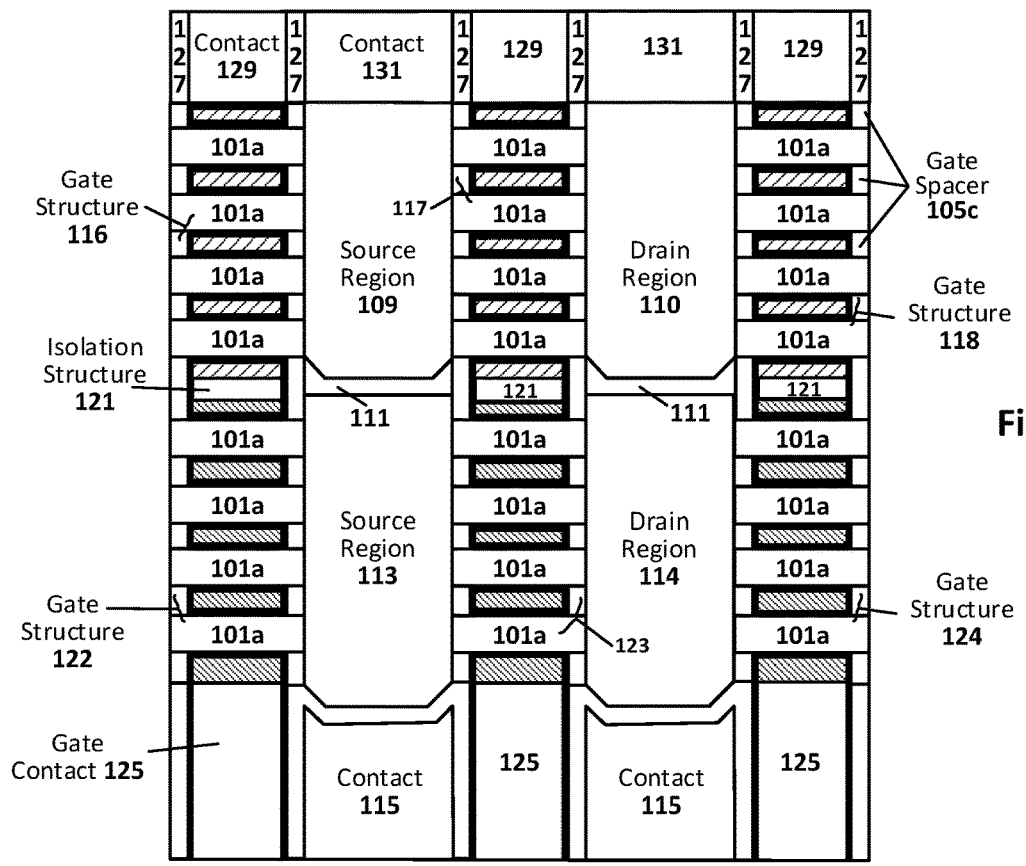

FIG. 11a is the same cross-sectional view of the structure of FIG. 10, after the structure has been rotated 180 degrees and the lower substrate 101a has been removed (e.g., CMP), and dielectric layer 127 has been deposited, in accordance with an embodiment. Dielectric 127 can be, for example, the same as dielectric 103 and 112. FIG. 11b is the same cross-sectional view of the structure of FIG. 11a, after dielectric layer 127 has been patterned and contacts 129 and 131 are deposited, in accordance with an embodiment. The previous relevant discussion with respect to contacts is equally applicable here, as will be appreciated.

Figure 12:
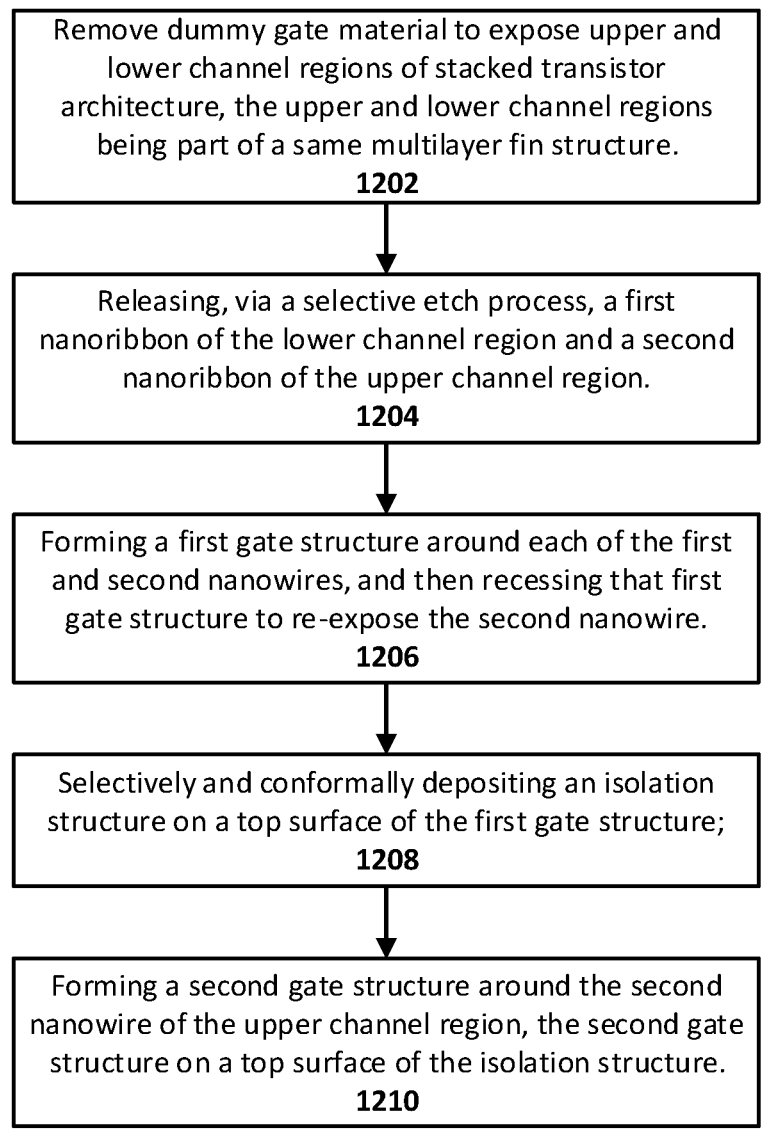
FIG. 12 illustrates a methodology for providing gate-to-gate isolation by a selective deposition structure, in accordance with some embodiments of the present disclosure.

FIG. 12 illustrates a methodology for forming an integrated circuit structure including a stacked transistor architecture with a self-aligned dielectric isolation layer between top and bottom gate structures, in accordance with some embodiments of the present disclosure. The method can be used to form, for instance, gate isolation structures 121 such as those shown in the examples of FIGS. 1a and 1b, although other integrated circuit structures may include such isolation structures as well.

The method includes removing 1202 dummy gate material to expose upper and lower channel regions of the stacked transistor architecture, the upper and lower channel regions being part of a same fin structure. In this example case, the fin structure is a multilayer fin structure suitable for nanoribbons, although other embodiments may have a different fin structure as previously explained.

The method continues with releasing 1204, via a selective etch process, a first nanoribbon of the lower channel region and a second nanoribbon of the upper channel region. In some cases, the longest distance between the top surface of the first nanoribbon and the bottom surface of the second nanoribbon is in the range of 10 to 60 nm, or 15 to 50 nm, or 15 to 40 nm, or 15 to 30 nm, or 15 to 25 nm.

The method continues with forming 1206 a first gate structure around each of the first and second nanoribbons of the lower and upper channel regions, respectively, and then recessing the first gate structure to re-expose the upper channel region, including the second nanoribbon. The method continues with selectively and conformally depositing 1208 an isolation structure on a top surface of the first gate structure, the isolation structure including dielectric material that selectively deposits on conductive material of the first gate structure. The method further includes forming 1210 a second gate structure around the second nanoribbon of the upper channel region, the second gate structure also on a top surface of the isolation structure. In some embodiments, ALD is used to deposit both the gate dielectric and gate electrode materials, as well as the isolation structure. In some cases, the dielectric material of the isolation structure includes silicon, and one or more of oxygen, carbon, and nitrogen.

In some embodiments, selectively and conformally depositing an isolation structure at 1208 includes applying a small molecule passivant that selectively deposits on exposed dielectric material, and depositing the dielectric material of the isolation structure that selectively deposits on the conductive material of the first gate structure rather than the small molecule passivant. The small molecule passivant may include, for instance, an amino silane. Specific examples include, for instance, nonafluorohexyldimethyl (dimethylamino)silane (NFHDDAS), n-octyldimethyl(dimethylamino)silane (ODDAS), trimethoxy(octadecyl)silane, and bis(N,N-dimethylamino)dimethylsilane (DMADMS). Such passivants can be used for silicon oxide ($SiO_x$) versus non-$SiO_x$ selective deposition systems. In a more general sense, and according to some embodiments, the passivant can be any passivant that will only attach to materials containing silicon, or silicon and oxygen, and will not attach to any exposed conductive materials (such as lower gate electrodes); in addition, the dielectric material to be deposited for the isolation structure will not deposit on the passivant and thus will only be deposited on the top surface of the lower gate structures.

In some embodiments, if a high-k gate dielectric remains on the upper channel region, an additional or alternative passivant can be used to passivate that high-k gate dielectric. For instance, consider the example case where a hafnium oxide film is present on the upper channel region, and the lower gate electrode includes tungsten-based materials. The relative acidity of the hafnium oxide surface is profoundly different than the tungsten or tungsten oxide gate electrode surface. In particular, while tungsten-based surfaces are very acidic (Lewis acid) in nature, hafnium oxide surfaces are basic in nature. For such combinations, a passivant with an acidic head group will preferentially attach to hafnium oxide and not the metal gate surface. Examples of such passivants include beta-diketonate acetylacetone (Hacac), octadecylphosphonic acid (ODPA), and dodecanethiol (DDT). So, by changing the passivant with different head-groups, different surfaces can be passivated. Once the passivation layer (or layers, as the case may be) is intact, the isolation structure can be selectively deposited on the lower gate structure.

In some cases, forming the first gate structure at 1206 includes depositing a first high-k gate dielectric and then depositing a first gate electrode, and forming the second gate structure at 1206 includes depositing a second high-k gate dielectric and then depositing a second gate electrode. In some cases, prior to forming the first gate structure at 1206, the method includes depositing a passivation layer on the second nanoribbon of the upper channel region, to protect that upper channel region from exposure to processing of the lower channel region. In some cases, the longest distance from a top surface of the first nanoribbon to a bottom surface of the second nanoribbon is in the range of 15 to 50 nm. In some cases, the largest thickness of the isolation structure between the first and second gate structures is within 10 angstroms of the smallest thickness of the isolation structure between the first and second gate structures, or within 8 angstroms, or within 6 angstroms, or within 4 angstroms. The average thickness of the isolation structure between the first and second gate structures may be, for instance, in the range of 5 to 45 nm, or 5 to 35 nm, or 5 to 25 nm.

In some cases, the method includes forming a first source region and a first drain region, each adjacent to the first nanoribbon, and forming a second source region and a second drain region, each adjacent to the second nanoribbon. In some cases, the first source and drain regions comprise one of a p-type or n-type dopant, and the second source and drain regions comprise the other of the p-type or n-type dopant.

Computing System

Figure 13:
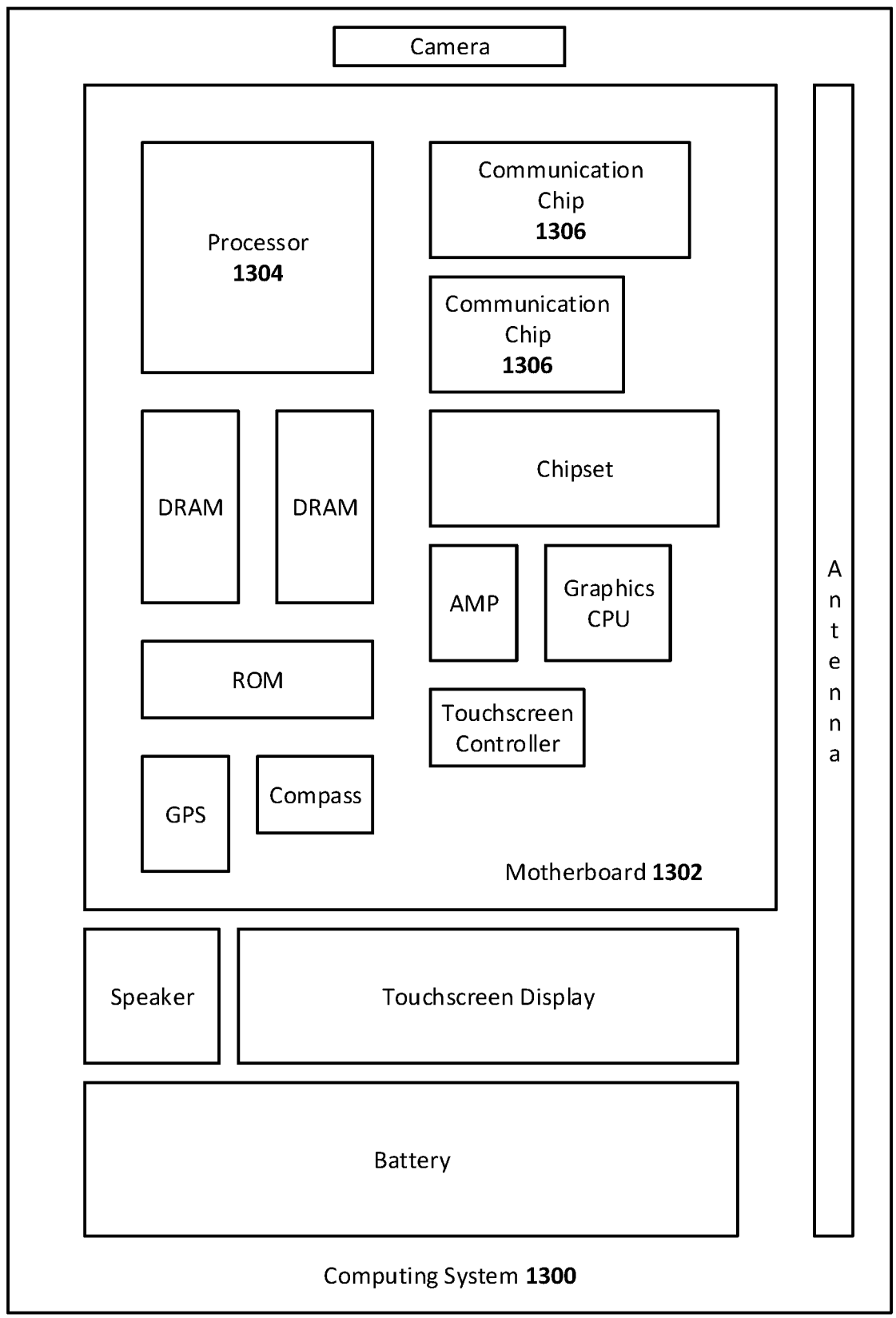
FIG. 13 illustrates a computing system implemented with one or more integrated circuit structures configured in accordance with an embodiment of the present disclosure.

FIG. 13 illustrates a computing system implemented with one or more integrated circuit structures configured in accordance with an embodiment of the present disclosure. As can be seen, the computing system 1300 houses a motherboard 1302. The motherboard 1302 may include a number of components, including but not limited to a processor 1304 and at least one communication chip 1306 (two are shown in this example), each of which can be physically and electrically coupled to the motherboard 1302, or otherwise integrated therein. As will be appreciated, the motherboard 1302 may be, for example, any printed circuit board, whether a main board or a daughterboard mounted on a main board or the only board of system 1300, etc. Depending on its applications, computing system 1300 may include one or more other components that may or may not be physically and electrically coupled to the motherboard 1302. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1300 may include one or more integrated circuits configured with a stacked transistor configuration having gate-to-gate isolation, as variously described herein. In some embodiments, multiple functions can be integrated into one or more chips (e.g., for instance, note that the communication chip 1306 can be part of or otherwise integrated into the processor 1304).

The communication chip 1306 enables wireless communications for the transfer of data to and from the computing system 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others. The processor 1304 of the computing system 1300 includes an integrated circuit die packaged within the processor 1304. In some example embodiments of the present disclosure, the integrated circuit die of the processor 1304 includes one or more occurrences of a selectively deposited gate-to-gate isolation structures as variously provided herein. The term "processor" may refer to any device or portion of a device that processes, for instance, electronic data from registers and/or memory to transform that electronic data into other electronic data that may be stored in registers and/or memory.

The communication chip 1306 may also include an integrated circuit die packaged within the communication chip 1306. In accordance with some such example embodiments, the integrated circuit die of the communication chip 1306 includes one or more occurrences of a selectively deposited gate-to-gate isolation structures as variously provided herein. As will be appreciated in light of this disclosure, note that multi-standard wireless capability may be integrated directly into the processor 1304 (e.g., where functionality of any chips 1306 is integrated into processor 1304, rather than having separate communication chips). Further note that processor 1304 may be a chip set having such wireless capability. In short, any number of processor 1304 and/or communication chips 1306 can be used. Likewise, any one chip or chip set can have multiple functions integrated therein.

In various implementations, the computing system 1300 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1300 may be any other electronic device that processes data or employs one or more selectively deposited gate-to-gate isolation structures as variously provided herein. As will be appreciated in light of this disclosure, various embodiments of the present disclosure can be used to improve performance on products fabricated at any process node (e.g., in the micron range, or sub-micron and beyond) by allowing for the use of vertically stacked transistors having any number of source/drain configurations and channel configurations, along with one or more selectively deposited gate-to-gate isolation structures as variously provided herein.

Further Example Embodiments

The following examples pertain to further embodiments, from which numerous permutations and configurations will be apparent.

Example 1 includes an integrated circuit structure, comprising: a first semiconductor body; a second semiconductor body above the first semiconductor body, wherein the longest distance between an upper surface of the first semiconductor body and a lower surface of the second semiconductor body is 50 nm or less, and wherein the first and second semiconductor bodies are part of a same fin structure; a first gate structure on the first semiconductor body; a second gate structure on the second semiconductor body; and an isolation structure between the first and second gate structures and comprising dielectric material, wherein the isolation structure is on and conformal to a top surface of the first gate structure, and a bottom surface of the second gate structure is on a top surface of the isolation structure, wherein variation of the isolation structure thickness between the first and second gate structures is less than 1 nm.

Example 2 includes the subject matter of Example 1, wherein the dielectric material of the isolation structure includes silicon, and one or more of oxygen, carbon, and nitrogen.

Example 3 includes the subject matter of Example 1 or 2, wherein the dielectric material of the isolation structure includes silicon, oxygen, and carbon.

Example 4 includes the subject matter of any one of Examples 1 through 3, wherein the first gate structure includes a first gate electrode and a first gate dielectric between the first gate electrode and the first semiconductor body, and/or the second gate structure includes a second gate electrode and a second gate dielectric between the second gate electrode and the second semiconductor body.

Example 5 includes the subject matter of any one of Examples 1 through 4, wherein the first semiconductor body includes a first nanoribbon, and the first gate structure wraps around the nanoribbon, and wherein the second semiconductor body includes a second nanoribbon, and the second gate structure wraps around the second nanoribbon, and wherein the longest distance is a distance from a top surface of the first nanoribbon to a bottom surface of the second nanoribbon is in the range of 15 to 50 nm.

Example 6 includes the subject matter of any one of Examples 1 through 5, wherein variation of the isolation structure thickness between the first and second gate structures is less than 8 angstroms.

Example 7 includes the subject matter of any one of Examples 1 through 6, wherein variation of the isolation structure thickness between the first and second gate structures is less than 6 angstroms.

Example 8 includes the subject matter of any one of Examples 1 through 7, wherein variation of the isolation structure thickness between the first and second gate structures is less than 4 angstroms.

Example 9 includes the subject matter of any one of Examples 1 through 8, and further includes: a first source region and a first drain region, each adjacent to the first semiconductor body; and a second source region and a second drain region, each adjacent to the second semiconductor body; wherein the first source and drain regions comprise one of a p-type or n-type dopant, and the second source and drain regions comprise the other of the p-type or n-type dopant.

Example 10 includes the subject matter of any one of Examples 1 through 9, wherein the longest distance between the upper surface of the first semiconductor body and the lower surface of the second semiconductor body is in the range of 15 to 40 nm.

Example 11 includes the subject matter of any one of Examples 1 through 10, wherein the longest distance between the upper surface of the first semiconductor body and the lower surface of the second semiconductor body is in the range of 15 to 30 nm.

Example 12 includes the subject matter of any one of Examples 1 through 11, wherein the longest distance between the upper surface of the first semiconductor body and the lower surface of the second semiconductor body is in the range of 15 to 20 nm.

Example 13 is a processor or memory comprising the integrated circuit structure of any one of Examples 1 through 12.

Example 14 is an integrated circuit structure, comprising: a first nanoribbon comprising a first semiconductor material; a second nanoribbon above the first nanoribbon and comprising the first semiconductor material, wherein the distance between a top surface of the first nanoribbon and a bottom surface of the second nanoribbon is in the range of 15 to 50 nm, and wherein the first and second nanoribbons are part of a same multilayer fin structure; a first gate structure around the first nanoribbon, the first gate structure including a first gate electrode and a first high-k gate dielectric between the first gate electrode and the first nanoribbon; a second gate structure around the second nanoribbon, the second gate structure including a second gate electrode and a second high-k gate dielectric between the second gate electrode and the second nanoribbon; and an isolation structure between the first and second gate structures and comprising dielectric material, wherein the isolation structure is on and conformal to a top surface of the first gate structure, and a bottom surface of the second gate structure is on a top surface of the isolation structure, wherein a largest thickness of the isolation structure between the first and second gate structures is within 10 angstroms of a smallest thickness of the isolation structure between the first and second gate structures.

Example 15 includes the subject matter of Example 14, wherein the dielectric material of the isolation structure includes silicon, oxygen, and carbon.

Example 16 includes the subject matter of Example 14 or 15, wherein isolation structure is self-aligned.

Example 17 includes the subject matter of any one of Examples 14 through 16, wherein the largest thickness of the isolation structure between the first and second gate structures is within 8 angstroms of the smallest thickness of the isolation structure between the first and second gate structures.

Example 18 includes the subject matter of any one of Examples 14 through 17, wherein the largest thickness of the isolation structure between the first and second gate structures is within 6 angstroms of the smallest thickness of the isolation structure between the first and second gate structures.

Example 19 includes the subject matter of any one of Examples 14 through 18, wherein the largest thickness of the isolation structure between the first and second gate structures is within 4 angstroms of the smallest thickness of the isolation structure between the first and second gate structures.

Example 20 includes the subject matter of any one of Examples 14 through 19, wherein isolation structure has a thickness between the first and second gate structures that is independent of independent of length and width of the first and second nanoribbons.

Example 21 includes the subject matter of any one of Examples 14 through 20, wherein the distance between the top surface of the first nanoribbon and the bottom surface of the second nanoribbon is in the range of 15 to 40 nm.

Example 22 includes the subject matter of any one of Examples 14 through 21, wherein the distance between the top surface of the first nanoribbon and the bottom surface of the second nanoribbon is in the range of 15 to 30 nm.

Example 23 includes the subject matter of any one of Examples 14 through 22, wherein the distance between the top surface of the first nanoribbon and the bottom surface of the second nanoribbon is in the range of 15 to 20 nm.

Example 24 is a processor or memory comprising the integrated circuit structure of any one of Examples 14 through 23.

Example 25 is an electronic system comprising the integrated circuit structure of any one of Examples 1 through 12 or 14 through 23, or the processor or memory of Example 13 or 24.

Example 26 is a method of forming an integrated circuit structure including a stacked transistor architecture with a self-aligned dielectric isolation layer between top and bottom gate structures, the method comprising: removing dummy gate material to expose upper and lower channel regions of the stacked transistor architecture, the upper and lower channel regions being part of a same multilayer fin structure; releasing, via a selective etch process, a first nanoribbon of the lower channel region and a second nanoribbon of the upper channel region; forming a first gate structure around each of the first and second nanoribbons of the lower and upper channel regions, respectively; recessing the first gate structure to re-expose the upper channel region, including the second nanoribbon; selectively and conformally depositing an isolation structure on a top surface of the first gate structure, the isolation structure including dielectric material that selectively deposits on conductive material of the first gate structure; and forming a second gate structure around the second nanoribbon of the upper channel region, the second gate structure also on a top surface of the isolation structure.

Example 27 includes the subject matter of Example 26, wherein selectively and conformally depositing an isolation structure includes: applying a small molecule passivant that selectively deposits on exposed dielectric material; and depositing the dielectric material of the isolation structure that selectively deposits on the conductive material of the first gate structure rather than the small molecule passivant.

Example 28 includes the subject matter of Example 27, wherein the small molecule passivant includes an amino silane.

Example 29 includes the subject matter of any one of Examples 26 through 28, wherein the dielectric material of the isolation structure includes silicon, and one or more of oxygen, carbon, and nitrogen.

Example 30 includes the subject matter of any one of Examples 26 through 29, wherein forming the first gate structure includes depositing a first high-k gate dielectric and then depositing a first gate electrode, and/or forming the second gate structure includes depositing a second high-k gate dielectric and then depositing a second gate electrode.

Example 31 includes the subject matter of any one of Examples 26 through 30, wherein prior to forming the first gate structure, the method includes depositing a passivation layer on the second nanoribbon of the upper channel region.

Example 32 includes the subject matter of any one of Examples 26 through 31, wherein a distance from a top surface of the first nanoribbon to a bottom surface of the second nanoribbon is in the range of 15 to 50 nm.

Example 33 includes the subject matter of any one of Examples 26 through 32, wherein a largest thickness of the isolation structure between the first and second gate structures is within 10 angstroms of a smallest thickness of the isolation structure between the first and second gate structures, the average thickness of the isolation structure between the first and second gate structures being in the range of 5 to 45 nm.

Example 34 includes the subject matter of any one of Examples 26 through 33, wherein a largest thickness of the isolation structure between the first and second gate structures is within 10 angstroms of a smallest thickness of the isolation structure between the first and second gate structures, the average thickness of the isolation structure between the first and second gate structures being in the range of 5 to 35 nm.

Example 35 includes the subject matter of any one of Examples 26 through 34, wherein a largest thickness of the isolation structure between the first and second gate structures is within 10 angstroms of a smallest thickness of the isolation structure between the first and second gate structures, the average thickness of the isolation structure between the first and second gate structures being in the range of 5 to 25 nm.

Example 36 includes the subject matter of any one of Examples 26 through 35, and further includes: forming a first source region and a first drain region, each adjacent to the first nanoribbon; and forming a second source region and a second drain region, each adjacent to the second nanoribbon; wherein the first source and drain regions comprise one of a p-type or n-type dopant, and the second source and drain regions comprise the other of the p-type or n-type dopant.

Example 37 includes the subject matter of any one of Examples 26 through 36, wherein a longest distance between a top surface of the first nanoribbon and a bottom surface of the second nanoribbon is in the range of 15 to 40 nm.

Example 38 includes the subject matter of any one of Examples 26 through 37, wherein a longest distance between a top surface of the first nanoribbon and a bottom surface of the second nanoribbon is in the range of 15 to 30 nm.

Example 39 includes the subject matter of any one of Examples 26 through 38, wherein a longest distance between a top surface of the first nanoribbon and a bottom surface of the second nanoribbon is in the range of 15 to 25 nm.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:
a first semiconductor body;
a second semiconductor body above the first semiconductor body, wherein a longest distance between an upper surface of the first semiconductor body and a lower surface of the second semiconductor body is 50 nm or less, and wherein the first and second semiconductor bodies are part of a same fin structure;
a first gate structure on the first semiconductor body such that a portion of the first gate structure contacts a top surface of the first semiconductor body;

a second gate structure on the second semiconductor body such that a portion of the second gate structure contacts a bottom surface of the second semiconductor body; and an isolation structure between the portion of the first gate structure and the portion of the second gate structure and comprising dielectric material, wherein the isolation structure contacts and is conformal to a top surface of the portion of the first gate structure, and the isolation structure contacts a bottom surface of the portion of the second gate structure, wherein variation of the isolation structure thickness between the first and second gate structures is less than 1 nm.

2. The integrated circuit structure of claim 1, wherein the dielectric material of the isolation structure includes silicon, and one or more of oxygen, carbon, and nitrogen.

3. The integrated circuit structure of claim 1, wherein the dielectric material of the isolation structure includes silicon, oxygen, and carbon.

4. The integrated circuit structure of claim 1, wherein the first gate structure includes a first gate electrode and a first gate dielectric between the first gate electrode and the first semiconductor body, and/or the second gate structure includes a second gate electrode and a second gate dielectric between the second gate electrode and the second semiconductor body.

5. The integrated circuit structure of claim 1, wherein the first semiconductor body includes a first nanoribbon, and the first gate structure wraps around the nanoribbon, and wherein the second semiconductor body includes a second nanoribbon, and the second gate structure wraps around the second nanoribbon, and wherein the longest distance is a distance from a top surface of the first nanoribbon to a bottom surface of the second nanoribbon and is in the range of 15 to 50 nm.

6. The integrated circuit structure of claim 1, wherein variation of the isolation structure thickness between the first and second gate structures is less than 6 angstroms.

7. The integrated circuit structure of claim 1, comprising:
a first source region and a first drain region, each adjacent to the first semiconductor body; and
a second source region and a second drain region, each adjacent to the second semiconductor body;
wherein the first source and drain regions comprise one of a p-type or n-type dopant, and the second source and drain regions comprise the other of the p-type or n-type dopant.

8. The integrated circuit structure of claim 1, wherein the longest distance between the upper surface of the first semiconductor body and the lower surface of the second semiconductor body is in the range of 15 to 40 nm.

9. The integrated circuit structure of claim 1, wherein the longest distance between the upper surface of the first semiconductor body and the lower surface of the second semiconductor body is in the range of 15 to 30 nm.

10. The integrated circuit structure of claim 1, wherein the longest distance between the upper surface of the first semiconductor body and the lower surface of the second semiconductor body is in the range of 15 to 20 nm.

11. An integrated circuit structure, comprising:
a first nanoribbon comprising a first semiconductor material;
a second nanoribbon above the first nanoribbon and comprising the first semiconductor material, wherein a distance between a top surface of the first nanoribbon and a bottom surface of the second nanoribbon is in the range of 15 to 50 nm, and wherein the first and second nanoribbons are part of a same multilayer fin structure;
a first gate structure around the first nanoribbon, the first gate structure including a first gate electrode and a first high-k gate dielectric between the first gate electrode and the first nanoribbon;
a second gate structure around the second nanoribbon, the second gate structure including a second gate electrode and a second high-k gate dielectric between the second gate electrode and the second nanoribbon; and
an isolation structure between the first and second nanoribbons and between the first and second gate structures and comprising dielectric material, wherein the isolation structure contacts and is conformal to a top surface of the first gate structure, and the isolation structure contacts a bottom surface of the second gate structure, wherein a largest thickness of the isolation structure between the first and second gate structures is within 10 angstroms of a smallest thickness of the isolation structure between the first and second gate structures.

12. The integrated circuit structure of claim 11, wherein the dielectric material of the isolation structure includes silicon, oxygen, and carbon.

13. The integrated circuit structure of claim 11, wherein the largest thickness of the isolation structure between the first and second gate structures is within 6 angstroms of the smallest thickness of the isolation structure between the first and second gate structures.

14. The integrated circuit structure of claim 11, wherein the distance between the top surface of the first nanoribbon and the bottom surface of the second nanoribbon is in the range of 15 to 40 nm.

15. The integrated circuit structure of claim 11, wherein the distance between the top surface of the first nanoribbon and the bottom surface of the second nanoribbon is in the range of 15 to 30 nm.

16. The integrated circuit structure of claim 11, wherein the distance between the top surface of the first nanoribbon and the bottom surface of the second nanoribbon is in the range of 15 to 20 nm.

17. A processor or memory comprising the integrated circuit structure of claim 14.

18. An integrated circuit structure, comprising:
a first semiconductor body extending in a first direction from a first source or drain region;
a second semiconductor body above the first semiconductor body and extending in the first direction from a second source or drain region, wherein a longest distance between an upper surface of the first semiconductor body and a lower surface of the second semiconductor body is 50 nm or less, and wherein the second source or drain region is above the first source or drain region;
a first gate structure on the first semiconductor body and extending in a second direction, such that a portion of the first gate structure contacts a top surface of the first semiconductor body;
a second gate structure on the second semiconductor body and extending in the second direction, such that a portion of the second gate structure contacts a bottom surface of the second semiconductor body; and
an isolation structure between the portion of the first gate structure and the portion of the second gate structure and comprising dielectric material, wherein the isolation structure abuts a top surface of the portion of the first gate structure and abuts a bottom surface of the portion of the second gate structure, and wherein variation of the isolation structure thickness between the first and second gate structures is less than 1 nm.

19. The integrated circuit structure of claim 18, wherein the dielectric material of the isolation structure includes silicon, oxygen, and carbon.

20. The integrated circuit structure of claim 18, wherein the longest distance between the upper surface of the first semiconductor body and the lower surface of the second semiconductor body is in the range of 15 to 30 nm.

* * * * *